(12) United States Patent
Fujiwara et al.

(10) Patent No.: US 8,922,754 B2
(45) Date of Patent: *Dec. 30, 2014

(54) IMMERSION EXPOSURE APPARATUS AND DEVICE FABRICATING METHOD WITH TWO SUBSTRATE STAGES AND METROLOGY STATION

(75) Inventors: Tomoharu Fujiwara, Ageo (JP); Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/007,348

(22) Filed: Jan. 9, 2008

(65) Prior Publication Data

US 2008/0117393 A1    May 22, 2008

Related U.S. Application Data

(62) Division of application No. 11/666,420, filed as application No. PCT/JP2005/020020 on Oct. 31, 2005, now Pat. No. 8,330,939.

(30) Foreign Application Priority Data

Nov. 1, 2004    (JP) ................... 2004-318017

(51) Int. Cl.
  *G03B 27/58*    (2006.01)
  *G03F 7/20*    (2006.01)
(52) U.S. Cl.
  CPC ........ *G03F 7/70341* (2013.01); *G03F 7/70733* (2013.01)
  USPC .......................................... 355/72

(58) Field of Classification Search
  USPC ............................. 355/30, 72, 73, 53, 74–76
  See application file for complete search history.

(56) References Cited

U.S. PATENT DOCUMENTS

| | | | |
|---|---|---|---|
| 4,346,164 | A | 8/1982 | Tabarelli et al. |
| 4,480,910 | A | 11/1984 | Takanashi et al. |
| 5,610,683 | A | 3/1997 | Takahashi |
| 5,715,039 | A | 2/1998 | Fukuda et al. |
| 5,825,043 | A | 10/1998 | Suwa |
| 5,969,441 | A | 10/1999 | Loopstra et al. |
| 6,341,007 | B1 | 1/2002 | Nishi et al. |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Nov. 19, 2009 Office Action issued in U.S. Appl. No. 11/666,420.

(Continued)

*Primary Examiner* — Chia-how Michael Liu
(74) *Attorney, Agent, or Firm* — Oliff PLC

(57) ABSTRACT

The present invention provides an exposure apparatus can suppress the occurrence of residual liquid. An exposure apparatus comprises: a first stage that holds the substrate and is movable; a second stage that is movable independently of the first stage; and a liquid immersion mechanism that forms a liquid immersion region of a liquid on an upper surface of at least one stage of the first stage and the second stage; wherein, a recovery port that is capable of recovering the liquid is provided to the upper surface of the second stage.

12 Claims, 14 Drawing Sheets

(56) References Cited

U.S. PATENT DOCUMENTS

| | | | |
|---|---|---|---|
| 6,426,790 B1* | 7/2002 | Hayashi | 355/72 |
| 6,509,957 B1 | 1/2003 | Tanaka | |
| 6,897,963 B1 | 5/2005 | Taniguchi et al. | |
| 7,119,876 B2* | 10/2006 | Van Der Toorn et al. | 355/53 |
| 7,161,659 B2 | 1/2007 | Van Den Brink et al. | |
| 7,349,069 B2* | 3/2008 | Beems et al. | 355/53 |
| RE43,576 E | 8/2012 | Van Den Brink et al. | |
| 2003/0128350 A1 | 7/2003 | Tanaka | |
| 2004/0160582 A1 | 8/2004 | Lof et al. | |
| 2004/0165159 A1 | 8/2004 | Lof et al. | |
| 2004/0207824 A1* | 10/2004 | Lof et al. | 355/30 |
| 2004/0211920 A1 | 10/2004 | Maria Derksen et al. | |
| 2004/0263809 A1 | 12/2004 | Nakano | |
| 2005/0219488 A1 | 10/2005 | Nei et al. | |
| 2006/0227308 A1 | 10/2006 | Brink et al. | |
| 2007/0127006 A1 | 6/2007 | Shibazaki | |

FOREIGN PATENT DOCUMENTS

| | | |
|---|---|---|
| EP | 0 687 957 A1 | 12/1995 |
| EP | 1 429 188 A2 | 6/2004 |
| EP | 1 571 695 A1 | 9/2005 |
| EP | 1 571 698 A1 | 9/2005 |
| EP | 1 635 382 | 3/2006 |
| EP | 1 647 865 A1 | 4/2006 |
| EP | 1 670 039 A1 | 6/2006 |
| EP | 1 713 113 A1 | 10/2006 |
| JP | A 57-117238 | 7/1982 |
| JP | A 58-202448 | 11/1983 |
| JP | A 59-019912 | 2/1984 |
| JP | A 62-065326 | 3/1987 |
| JP | A 63-157419 | 6/1988 |
| JP | A 4-065603 | 3/1992 |
| JP | A 4-305915 | 10/1992 |
| JP | A 4-305917 | 10/1992 |
| JP | A 5-021314 | 1/1993 |
| JP | A 5-062877 | 3/1993 |
| JP | A 6-124873 | 5/1994 |
| JP | A 7-176468 | 7/1995 |
| JP | A 7-220990 | 8/1995 |
| JP | A 8-037149 | 2/1996 |
| JP | A-08-051069 | 2/1996 |
| JP | A 8-316125 | 11/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-016816 | 1/1999 |
| JP | A 11-176727 | 7/1999 |
| JP | A 2000-058436 | 2/2000 |
| JP | A 2000-505958 | 5/2000 |
| JP | A 2001-160530 | 6/2001 |
| JP | A 2001-267239 | 9/2001 |
| JP | A 2002-014005 | 1/2002 |
| JP | A 2004-207711 | 7/2004 |
| JP | A-2004-289127 | 10/2004 |
| JP | A-2004-289128 | 10/2004 |
| JP | A-2005-019864 | 1/2005 |
| JP | A-2006-121077 | 5/2006 |
| JP | T-2006-523026 | 10/2006 |
| JP | T-2006-523027 | 10/2006 |
| JP | T-2006-523028 | 10/2006 |
| JP | T-2006-523029 | 10/2006 |
| JP | T-2006-523377 | 10/2006 |
| WO | WO 99/49504 | 9/1999 |
| WO | WO 2004/019128 A2 | 3/2004 |
| WO | WO 2004/053953 A1 | 6/2004 |
| WO | WO 2004/090577 A2 | 10/2004 |
| WO | WO 2004/092830 A2 | 10/2004 |
| WO | WO 2004/092833 A2 | 10/2004 |
| WO | WO 2004/093159 A2 | 10/2004 |
| WO | WO 2004/093160 A2 | 10/2004 |
| WO | WO 2005/010611 A2 | 2/2005 |
| WO | WO 2005/022616 A1 | 3/2005 |

OTHER PUBLICATIONS

Dec. 7, 2009 Search Report issued in European Patent Application No. 05 80 5449.
Jan. 13, 2011 Office Action issued in Israeli Patent Application No. 182850 (with English interpretation).
Sep. 17, 2010 Office Action issued in Chinese Patent Application No. 200910149533.5 (with English Translation).
Office Action from parent U.S. Appl. No. 11/666,420 mailed Aug. 19, 2010.
Office Action mailed Mar. 29, 2011 issued in Japanese Patent Application No. 2006-542376 (w/translation).
Office Action dated May 6, 2011 issued in Chinese Patent Application No. 200910149533.5 (with Translation).
Final Rejection mailed Apr. 14, 2011 issued in U.S. Appl. No. 11/666,420.
Office Action dated Mar. 23, 2011 issued in Indian Patent Application No. 1751/KOLNP/2007.
Notice of Allowance dated Sep. 20, 2011 issued in Japanese Patent Application No. 2006-542376 (with translation).
Office Action dated Nov. 29, 2011 issued in Korean Patent Application No. 2007-7004288 (with translation).
Office Action issued in related Chinese Patent Application No. 200580037186.7 on Nov. 7, 2008 w/English language translation.
Office Action issued in related European Patent Application No. 05805449.5 on Apr. 1, 2010.
Office Action issued in related Singapore Patent Application No. 200703230-3 on Jul. 3, 2008.
Notice of Allowance issued in related Singapore Application No. 200703230-3 on Apr. 9, 2009.
International Search Report issued in related PCT Application No. PCT/JP2005/020020 with English language translation.
Written Opinion of the International Searching Authority issued in related PCT Application No. PCT/JP2005/020020 with English language translation.
Office Action from U.S. Appl. No. 12/666,420 mailed Jan. 5, 2009.
Office Action from U.S. Appl. No. 12/666,420 mailed Nov. 19, 2009.
Translation of JP-A-57-117238.
Translation of JP-A-04-065603.
Office Action dated Nov. 10, 2011 issued in U.S. Appl. No. 11/666,420.
Office Action for European Patent Application No. 05805449.5 issued Oct. 1, 2012.
Mar. 6, 2013 Office Action issued in Taiwanese Patent Application No. 094138185 (with English translation).
Office Action issued in Japanese Application No. 2010-255401 dated Aug. 7, 2012 (with translation).
Search Report issued in European Application No. 12 16 2495.1 dated Jun. 6, 2012.
Aug. 28, 2012 Office Action issued in Israeli Patent Application No. 182850 (with translation).

* cited by examiner

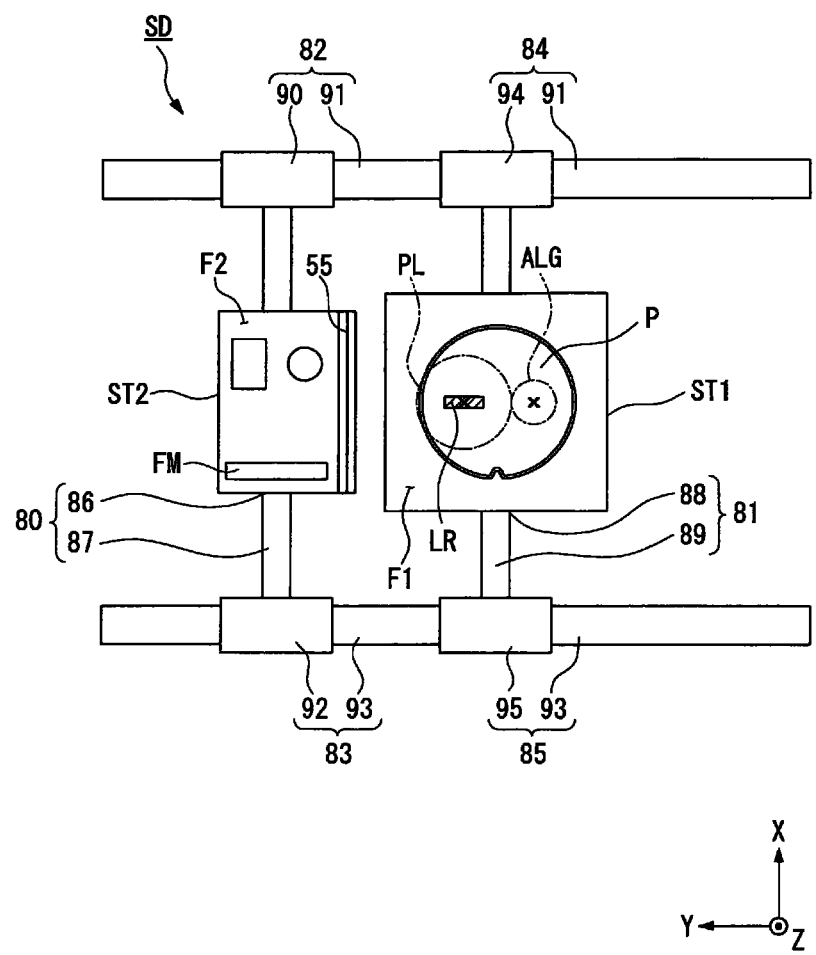

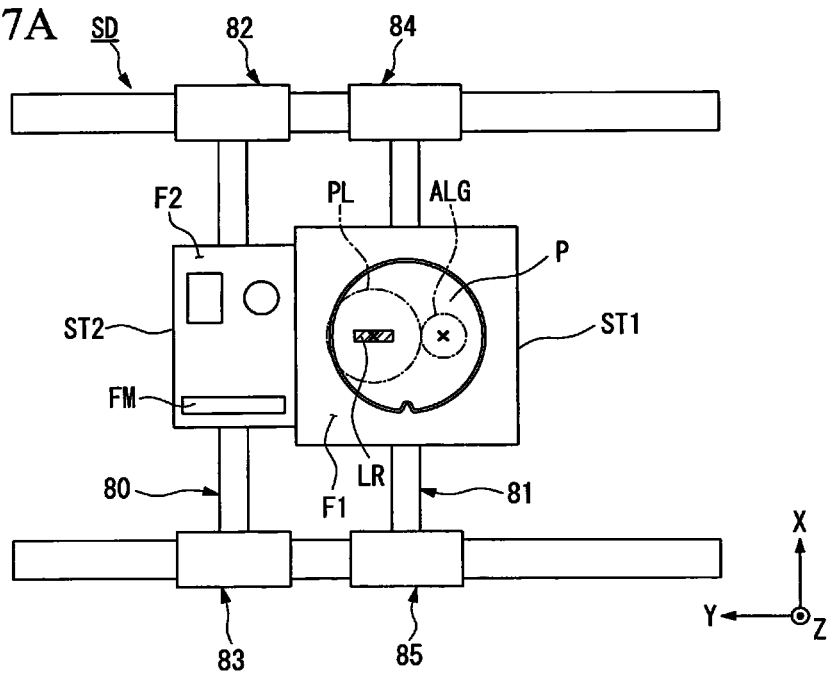
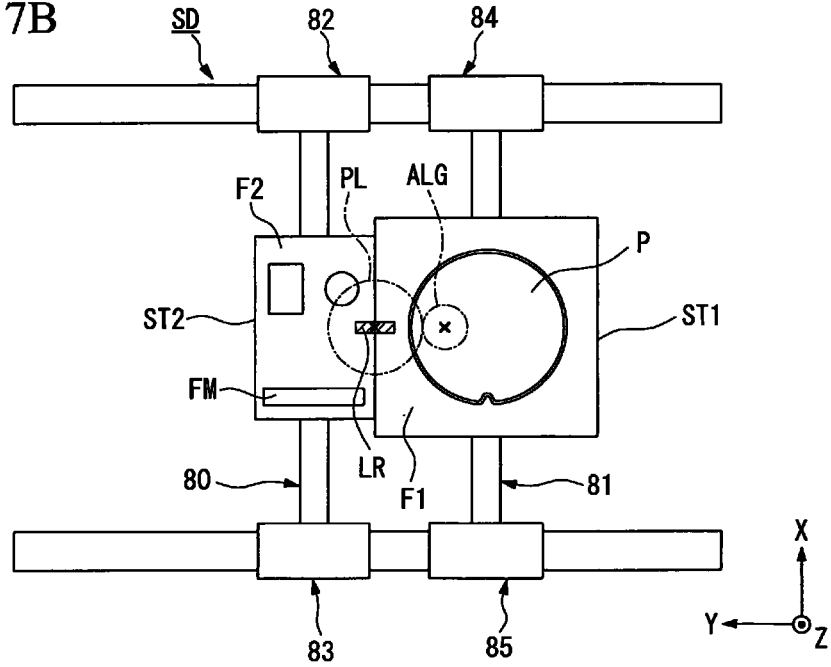

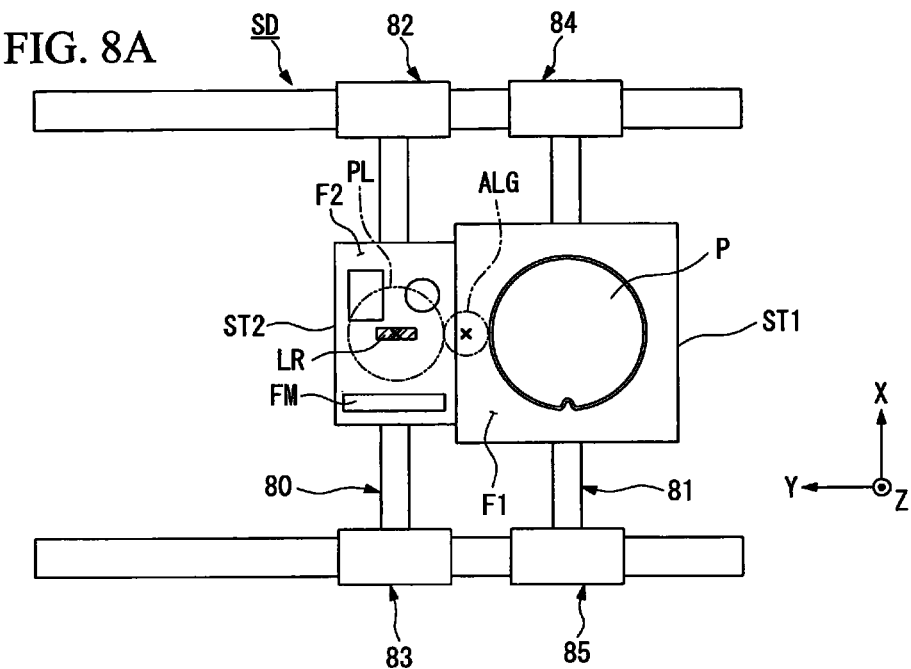
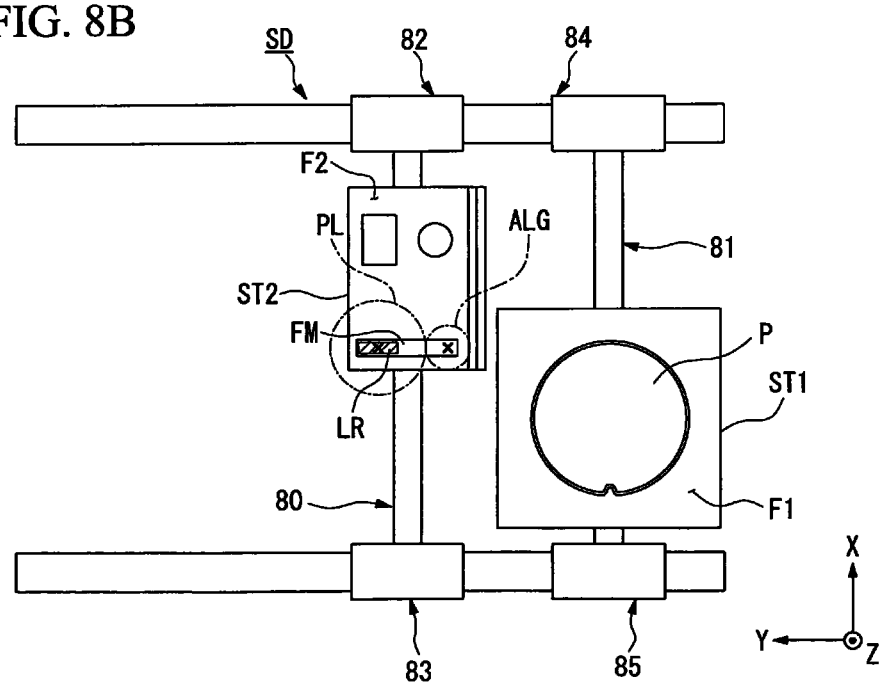

IMMERSION EXPOSURE APPARATUS AND DEVICE FABRICATING METHOD WITH TWO SUBSTRATE STAGES AND METROLOGY STATION

This is a Divisional of U.S. patent application Ser. No. 11/666,420, filed Apr. 27, 2007 now U.S. Pat. No. 8,330,939 is the U.S. National Stage of International Application No. PCT/JP2005/020020 filed Oct. 31, 2005. The disclosure of each of the above-identified applications is incorporated herein by reference in its entirety.

TECHNICAL FIELD

The present invention relates to an exposure apparatus that exposes a substrate through a projection optical system, and a device fabricating method.

The present application claims priority to Patent Application No. 2004-318017 filed on Nov. 1, 2004, and the contents thereof are incorporated herein by reference.

BACKGROUND ART

The process of photolithography, which is one of the processes for manufacturing a microdevice such as a semiconductor device and a liquid crystal display device, uses an exposure apparatus that projects the image of a pattern formed on a mask onto a photosensitive substrate. This exposure apparatus comprises a mask stage that supports a mask as well as a substrate stage that supports a substrate, and projects an image of the pattern of the mask onto the substrate through a projection optical system while successively moving the mask stage and the substrate stage. In addition, there are exposure apparatuses that are designed, for example, to improve throughput by providing two independently moveable stages on the image plane side of the projection optical system. In microdevice fabrication, there is a demand to increase the fineness of the patterns formed on substrates in order to increase device density. To meet this demand, it is preferable to further increase the resolution of exposure apparatuses. As one means to achieve this increase in resolution, an immersion exposure apparatus has been proposed, as disclosed in Patent Document 1 below, that forms a liquid immersion region by filling a liquid between the projection optical system and the substrate, and performs an exposure process through the liquid of that liquid immersion region.

Patent Document 1: PCT International Publication No. WO 99/49504

DISCLOSURE OF INVENTION

Problems to be Solved by the Invention

In an immersion exposure apparatus, there are cases (for example, during maintenance) wherein it is desired to recover all of the liquid of the liquid immersion region. In such a case, if the liquid is not fully recovered and some remains, then there is a possibility that the residual liquid will scatter to the various equipment that constitute the exposure apparatus and adversely affect that equipment. In addition, there is a risk that the residual liquid will cause fluctuations in the environment (for example, its humidity) wherein the exposure apparatus is disposed, and thereby adversely affect, for example, exposure and measurement accuracies.

A purpose of some aspects of the invention is to provide an exposure apparatus that can maintain a desired performance by suppressing the occurrence of residual liquid, and a device fabricating method.

Means for Solving the Problem

A first aspect of the present invention provides an exposure apparatus that exposes a substrate through a projection optical system, comprising: a first stage that holds the substrate and is movable within a two dimensional plane on the image plane side of the projection optical system that is substantially parallel to the image plane; a second stage that is movable independently of the first stage within a two dimensional plane on the image plane side of the projection optical system that is substantially parallel to the image plane; and a liquid immersion mechanism that forms a liquid immersion region of a liquid on an upper surface of at least one stage of the first stage and the second stage; wherein, a recovery port that is capable of recovering the liquid is provided to or in the vicinity of the upper surface of the second stage.

According to the first aspect of the invention, the recovery port that recovers the liquid is provided to or in the vicinity of the upper surface of the second stage, which is disposed on the image plane side of the projection optical system, and it is therefore possible to satisfactorily recover the liquid and to suppress the occurrence of residual liquid.

A second aspect of the present invention provides a device fabricating method, wherein an exposure apparatus according to the above aspect is used.

According to the second aspect of the invention, it is possible to fabricate a device with an exposure apparatus that maintains a desired performance.

Effects of the Invention

According to the present invention, it is possible to suppress the occurrence of residual liquid, and to perform the exposure process and the measurement process with good accuracy.

BRIEF DESCRIPTION OF THE DRAWINGS

FIG. 6 is a plan view of the substrate stage and the measurement stage, viewed from above.
FIG. 7A is for explaining the operation of the substrate stage and the measurement stage.
FIG. 7B is for explaining the operation of the substrate stage and the measurement stage.
FIG. 8A is for explaining the operation of the substrate stage and the measurement stage.
FIG. 8B is for explaining the operation of the substrate stage and the measurement stage.

BEST MODE FOR CARRYING OUT THE INVENTION

The following explains the embodiments of the present invention, referencing the drawings, but the present invention is not limited thereto.

First Embodiment

Figure 1:
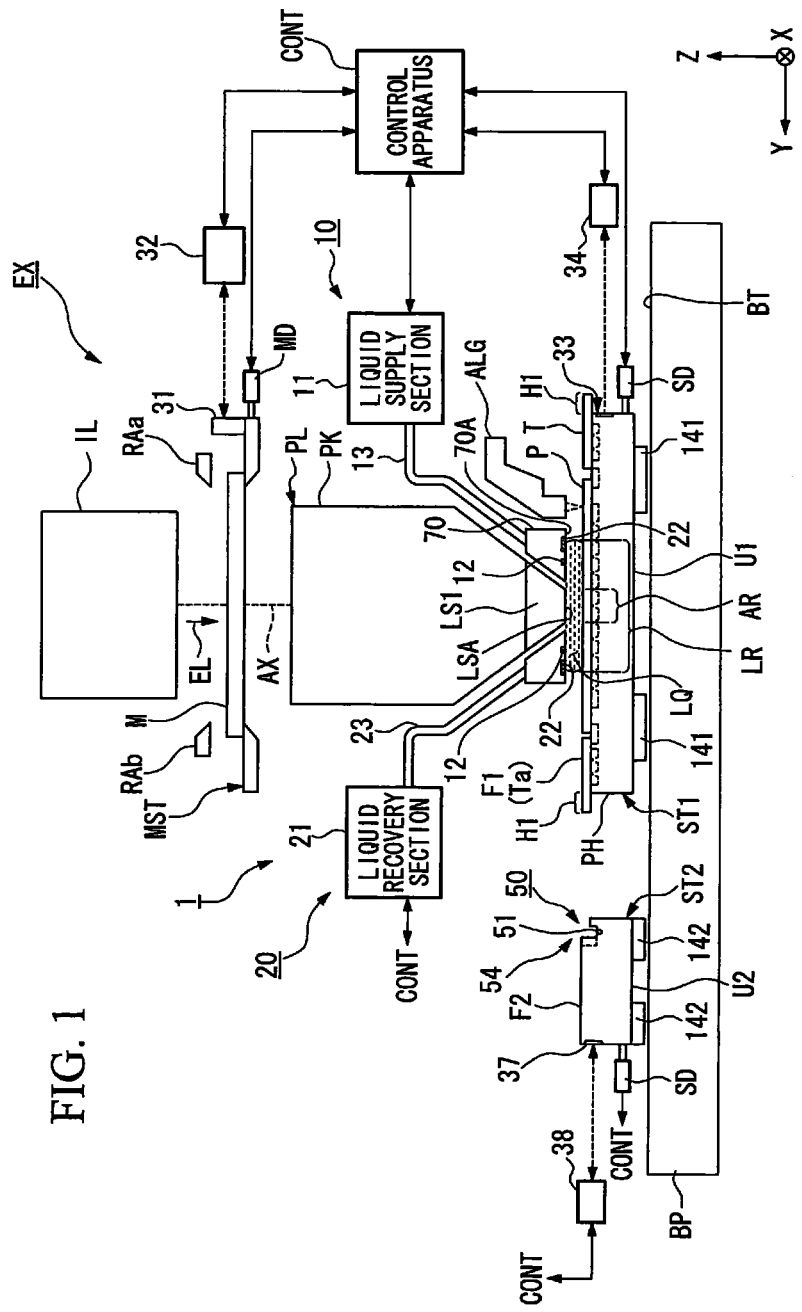
FIG. 1 is a schematic block diagram that shows the exposure apparatus according to a first embodiment.

FIG. 1 is a schematic block diagram that shows an exposure apparatus according to a first embodiment. In FIG. 1, an exposure apparatus EX comprises: a movable mask stage MST that holds a mask M; a movable substrate stage ST1 that holds a substrate P; a movable measurement stage ST2 on which measuring instruments that perform measurements related to an exposure process are mounted; an illumination optical system IL that illuminates the mask M supported by the mask stage MST with exposure light EL; a projection optical system PL, which projects an image of the pattern of the mask M illuminated by the exposure light EL onto the substrate P held by the substrate stage ST1; and a control apparatus CONT that performs supervisory control of the entire operation of the exposure apparatus EX. The substrate stage ST1 and the measurement stage ST2, which are each movably supported on a base member BP, are independently movable. A gas bearing 141 that noncontactually supports the substrate stage ST1 on an upper surface BT of the base member BP is provided to a lower surface U1 of the substrate stage ST1. Likewise, a gas bearing 142 for noncontactually supporting the measurement stage ST2 on the upper surface BT of the base member BP is provided to a lower surface U2 of the measurement stage ST2. The substrate stage ST1 and the measurement stage ST2 are each independently movable within a two dimensional plane (XY plane) on the image plane side of the projection optical system PL that is substantially parallel to that image plane.

The exposure apparatus EX of the present embodiment is a liquid immersion exposure apparatus that adapts the liquid immersion method to substantially shorten the exposure wavelength, improve the resolution, as well as substantially increase the depth of focus, and comprises a liquid immersion mechanism 1 for forming a liquid immersion region LR of a liquid LQ on the image plane side of the projection optical system PL. The liquid immersion mechanism 1 comprises: a nozzle member 70, which is provided in the vicinity of the image plane side of the projection optical system PL, has supply ports 12 that supply the liquid LQ and recovery ports 22 that recover the liquid LQ; a liquid supply mechanism 10 that supplies the liquid LQ to the image plane side of the projection optical system PL through the supply ports 12 provided to the nozzle member 70; and a liquid recovery mechanism 20 that recovers the liquid LQ on the image plane side of the projection optical system PL through the recovery ports 22 provided to the nozzle member 70. The nozzle member 70 is annularly formed so that it surrounds a tip portion of the projection optical system PL on the image plane side. At least during the projection of the image of the pattern of the mask M onto the substrate P, the liquid immersion mechanism 1 uses the liquid LQ that is supplied by the liquid supply mechanism 10 to locally form the liquid immersion region LR of the liquid LQ, which is larger than a projection area AR and smaller than the substrate P, on one part of the substrate P that includes the projection area AR of the projection optical system PL. Specifically, the exposure apparatus EX employs a local liquid immersion system that fills the liquid LQ in the space of the optical path that is between a lower surface LSA of a first optical element LS1, which is closest to the image plane of the projection optical system PL, and one part of the upper surface of the substrate P that is disposed on the image plane side of the projection optical system PL, and then exposes the substrate P by projecting a pattern of the mask M onto the substrate P by irradiating such with the exposure light EL that passes through the mask M via the projection optical system PL and the liquid LQ that forms the liquid immersion region LR.

In addition, the liquid immersion mechanism 1 can locally form the liquid immersion region LR of the liquid LQ not just on the upper surface of the substrate P, but also on at least one of an upper surface F1 of the substrate stage ST1 and an upper surface F2 of the measurement stage ST2. Furthermore, recovery ports 51 that can recover at least part of the liquid LQ of the liquid immersion region LR are provided to the measurement stage ST2.

Furthermore, the liquid immersion mechanism 1 is not limited to the one disclosed in the present embodiment, and various aspects can be employed. For example, it is possible to employ the liquid immersion mechanism disclosed in, for example, U.S. Patent Publication No. 2004/0160582.

The present embodiment will now be explained as exemplified by a case wherein a scanning type exposure apparatus (a so-called scanning stepper) is used as the exposure apparatus EX that projects an image of the pattern formed on the mask M onto the substrate P while synchronously moving the mask M and the substrate P in mutually different scanning directions (reverse directions). In the following explanation, the directions in which the mask M and the substrate P synchronously move within the horizontal plane are the X axial directions (scanning directions), the directions orthogonal to the X axial directions within the horizontal plane are the Y axial directions (non-scanning directions), and the directions that are perpendicular to the X and Y axial directions and that coincide with an optical axis AX of the projection optical system PL are the Z axial directions. In addition, the rotational (inclined) directions about the X, Y, and Z axial directions and the θX, θY, and θZ directions, respectively. Furthermore, "substrate" herein includes one wherein the substrate, for example, a semiconductor wafer is coated with a photosensitive material (photoresist), and "mask" includes a reticle wherein a device pattern is formed that is reduction projected onto the substrate.

The substrate stage ST1 and the measurement stage ST2 are each movable by the drive of a drive mechanism SD that includes, for example, a linear motor. By controlling the drive mechanism SD, the control apparatus CONT can move the substrate stage ST1 and the measurement stage ST2 together in the XY plane while maintaining a prescribed state, wherein the upper surface F1 of the substrate stage ST1 and the upper surface F2 of the measurement stage ST2 are proximate (close) to or in contact with one another in a prescribed area that includes the area directly below the projection optical system PL. By moving the substrate stage ST1 together with the measurement stage ST2, the control apparatus CONT can move the liquid immersion region LR between the upper surface F1 of the substrate stage ST1 and the upper surface F2 of the measurement stage ST2 in a state wherein the liquid LQ is retained between the projection optical system PL and at least one of the upper surface F1 of the substrate stage ST1 and the upper surface F2 of the measurement stage ST2.

In addition, a protruding portion (overhanging portion) H1, which projects toward the measurement stage ST2, is provided on the +Y side of the substrate stage ST1, and a recessed portion 54 that corresponds to the overhanging portion H1 is provided on the −Y side of the measurement stage ST2. Furthermore, the overhanging portion H1 is also provided on the −Y side of the substrate stage ST1. Furthermore, the +Y side area of the upper surface of the substrate stage ST1 and the −Y side area of the upper surface of the measurement stage ST2 are proximate to or in contact with one another. In the present embodiment, because the overhanging portion H1 is provided on the +Y side of the substrate stage ST1 and the recessed portion 54 is provided on the −Y side of the measurement stage ST2, the area of the upper surface of the substrate stage ST1 in the vicinity of the overhanging portion H1 and the area of the upper surface of the measurement stage ST2 in the vicinity of the recessed portion 54 are proximate to or in contact with one another. Furthermore, the recovery ports 51 are provided in the vicinity of the area where the upper surfaces of the measurement stage ST2 and the substrate stage ST1 are proximate to or in contact with one another; specifically, the recovery ports 51 are provided to the inner side of the recessed portion 54.

Here, the "proximate state" between the substrate stage ST1 and the measurement stage ST2 means the state when the liquid immersion region LR has moved between the upper surface F1 of the substrate stage ST1 and the upper surface F2 of the measurement stage ST2, and the substrate stage ST1 and the measurement stage ST2 have approached one another to the extent that the liquid LQ does not leak out from between them; furthermore, the permissible value of the spacing between both stages ST1, ST2 differs depending on, for example, the material properties and the surface treatment of both stages, and the type of the liquid LQ.

The illumination optical system IL comprises: an exposure light source; an optical integrator that uniformizes the luminous flux intensity of the light beam emitted from the exposure light source; a condenser lens that condenses the exposure light EL from the optical integrator; a relay lens system; and a field stop that sets an illumination region on the mask M illuminated by the exposure light EL. The illumination optical system IL illuminates the prescribed illumination region on the mask M with the exposure light EL, which has a uniform luminous flux intensity distribution. Examples of light that can be used as the exposure light EL emitted from the illumination optical system IL include: deep ultraviolet (DUV) light such as the bright lines (g-rays, h-rays, and i-rays) emitted from a mercury lamp and the like, and KrF excimer laser light (248 nm wavelength); and vacuum ultraviolet (VUV) light such as ArF excimer laser light (193 nm wavelength) and $F_2$ laser light (157 nm wavelength). ArF excimer laser light is used in the present embodiment.

In the present embodiment, pure water (purified water) is used as the liquid LQ. Pure water is capable of transmitting not only ArF excimer laser light, but also DUV light such as the bright lines (g-rays, h-rays, and i-rays) emitted from a mercury lamp and the like, and KrF excimer laser light (248 nm wavelength).

The movable mask stage MST holds the mask M. The mask stage MST holds the mask M via vacuum chucking (or electrostatic chucking). The mask stage MST, in a state wherein it is holding the mask M, is movable in two dimensions within a plane perpendicular to the optical axis AX of the projection optical system PL, i.e., within the XY plane, and is finely rotatable in the θZ directions by the drive of a drive mechanism MD, which includes a linear motor that is controlled by the control apparatus CONT. Movable mirrors 31 are provided on the mask stage MST. In addition, a laser interferometer 32 is provided at a position opposing each movable mirror 31. The laser interferometers 32 measure in real time the position in the two dimensional directions, as well as the rotational angle in the θZ directions (depending on the case, including the rotational angles in the θX and θY directions) of the mask M on the mask stage MST. The measurement results of the laser interferometers 32 are outputted to the control apparatus CONT. Based on the measurement results of the laser interferometers 32, the control apparatus CONT controls the position of the mask M, which is held on the mask stage MST, by driving the drive mechanism MD.

The projection optical system PL, which projects the pattern of the mask M onto the substrate P at a prescribed projection magnification β, comprises a plurality of optical elements that are held by a lens barrel PK. In the present embodiment, the projection optical system PL is a reduction system that has a projection magnification P of, for example, ¼, ⅕, or ⅛. Furthermore, the projection optical system PL may also be a unity magnification system or an enlargement system. In addition, the projection optical system PL may be: a dioptric system that does not include reflecting optical elements; a catoptric system that does not include refracting optical elements; or a catadioptric system that includes both reflecting optical elements and refracting optical elements. Among the plurality of optical elements that constitute the projection optical system PL, the first optical element LS1, which is the closest to the image plane of the projection optical system PL, protrudes from the lens barrel PK.

The substrate stage ST1 comprises a substrate holder PH, which holds the substrate P, and a plate member T that is held by the substrate holder PH, which is movable on the image plane side of the projection optical system PL. The substrate holder PH holds the substrate P via, for example, vacuum chucking. The substrate stage ST1, in a state wherein it is holding the substrate P via the substrate holder PH, is movable in two dimensions within the XY plane that is substantially parallel to the image plane of the projection optical system PL on the image plane side of the projection optical system PL, and can be finely rotated in the θZ directions by the drive of the drive mechanism SD, which includes a linear motor that is controlled by the control apparatus CONT. Furthermore, the substrate stage ST1 is also movable in the Z axial directions and the θX and θY directions. Accordingly, the upper surface of the substrate P held by the substrate stage ST1 is movable in the directions of six degrees of freedom, i.e., the X, Y, and Z axial directions and the θX, θY, and θZ directions. Movable mirrors 33 are each provided to a side surface of the substrate stage ST1. In addition, a laser interferometer 34 is provided at a position opposing each movable mirror 33. The laser interferometers 34 measure in real time the position in the two dimensional directions as well as the rotational angle of the substrate P on the substrate stage ST1. In addition, the exposure apparatus EX comprises an oblique incidence type focus leveling detection system (not shown) that detects surface position information of the upper surface of the substrate P that is supported by the substrate stage ST1 as disclosed in, for example, Japanese Unexamined Patent Application, Publication No. H08-37149. The focus leveling detection system detects the surface position information (positional information in the Z axial directions, and inclination information in the θX and θY directions of the substrate P) of the upper surface of the substrate P. Furthermore, the focus leveling detection system may also employ a system that uses an electrostatic capacitance type sensor. The measurement results of the laser interferometers 34 are output to the control apparatus CONT. The detection results of the focus leveling detection system are also output to the control apparatus CONT. Based on the detection results of the focus leveling detection system, the control apparatus CONT aligns the upper surface of the substrate P with the image plane of the projection optical system PL by driving the drive mechanism SD and controlling the focus position (Z position) and inclination angle ($\theta X$ and $\theta Y$) of the substrate P; in addition, based on the measurement results of the laser interferometers 34, the control apparatus CONT controls the position of the substrate P in the X and Y axial directions and the $\theta Z$ directions.

The measurement stage ST2 mounts various measuring instruments (including a measuring member) that perform measurements related to the exposure process, and is movable on the image plane side of the projection optical system PL. Examples of such measuring instruments include: a fiducial mark plate whereon a plurality of fiducial (reference) marks are formed as disclosed in, for example, Japanese Unexamined Patent Application, Publication No. H5-21314; a nonuniformity sensor for measuring the luminous flux intensity nonuniformity as disclosed in, for example, Japanese Unexamined Patent Application, Publication No. S57-117238 and for measuring the amount of fluctuations in the transmittance of a projection optical system PL for exposure light EL as disclosed in Japanese Unexamined Patent Application, Publication No. 2001-267239; an aerial image measuring sensor as disclosed in Japanese Unexamined Patent Application, Publication No. 2002-14005; and an irradiance sensor (luminous flux intensity sensor) as disclosed in Japanese Unexamined Patent Application, Publication No. H11-16816. Like the upper surface F1 of the substrate stage ST1, the upper surface F2 of the measurement stage ST2 is a flat surface (flat portion).

In the present embodiment, to perform immersion exposure, in which the substrate P is exposed with the exposure light EL through the projection optical system PL and the liquid LQ, the abovementioned nonuniformity sensor, aerial image measuring sensor, and irradiance sensor, which are employed in measurements that use the exposure light EL, receive the exposure light EL through the projection optical system PL and the liquid LQ. Furthermore, for example, one part of the optical system of each sensor may be mounted on the measurement stage ST2, or the entire sensor may be disposed thereon.

In a state wherein the measuring instruments are mounted, the measurement stage ST2 can be moved in two dimensions within the XY plane that is substantially parallel to the image plane of the projection optical system PL on the image plane side thereof, and can be finely rotated in the $\theta Z$ directions by the drive of the drive mechanism SD, which includes a linear motor that is controlled by the control apparatus CONT. Furthermore, the measurement stage ST2 is also movable in the Z axial directions and the $\theta X$ and $\theta Y$ directions. Namely, like the substrate stage ST1, the measurement stage ST2 is movable in the directions of six degrees of freedom, i.e., the X, Y, and Z axial directions and the $\theta X$, $\theta Y$, and $\theta Z$ directions. Movable mirrors 37 are each provided to a side surface of the measurement stage ST2. In addition, a laser interferometer 38 is provided at a position opposing each movable mirror 37. The laser interferometers 38 measure in real time the position in the two dimensional directions and the rotational angle of the measurement stage ST2.

An off axis alignment system ALG, which detects alignment marks on the substrate P and fiducial marks on the fiducial mark plate, is provided in the vicinity of the tip of the projection optical system PL. With the alignment system ALG of the present embodiment, a FIA (Field Image Alignment) system of the type disclosed in, for example, Japanese Unexamined Patent Application, Publication No. H4-65603 is employed that: irradiates a target mark on the substrate P with a broadband detection light beam that does not photosensitize the photosensitive material on the substrate P; uses an imaging device (e.g., a CCD) to capture an image of an index (an index pattern on an index plate provided in the alignment system ALG), which is not shown, and an image of the target mark that is imaged on a light receiving surface by the light reflected from that target mark; and measures the position of the mark by image processing these imaging signals.

In addition, two mask alignment systems RAa, RAb, each of which comprises a TTR type alignment system, are provided in the vicinity of the mask stage MST spaced apart in the Y axial directions by a prescribed spacing, wherein light of the exposure light wavelength is used to simultaneously observe an alignment mark on the mask M and a corresponding fiducial mark on the fiducial mark plate through the projection optical system PL. The mask alignment system of the present embodiment employs a VRA (Visual Reticle Alignment) system that detects the position of a mark by irradiating the mark with light and image processing the image data of the mark imaged by, for example, a CCD camera, as disclosed in, for example, Japanese Unexamined Patent Application, Publication No. H7-176468.

The liquid supply mechanism 10 and the liquid recovery mechanism 20 of the liquid immersion mechanism 1 will now be explained. The liquid supply mechanism 10 supplies the liquid LQ to the image plane side of the projection optical system PL and comprises a liquid supply section 11, which is capable of feeding the liquid LQ, as well as a supply pipe 13, which has one end portion that is connected to the liquid supply section 11. The other end portion of the supply pipe 13 is connected to the nozzle member 70. An internal passageway (supply passageway) that connects the supply ports 12 and the other end portion of the supply pipe 13 is formed inside the nozzle member 70. The liquid supply section 11 comprises, for example, a tank that stores the liquid LQ, a pressure pump, and a filter unit that removes foreign matter from the liquid LQ. The control apparatus CONT controls the liquid supply operation of the liquid supply section 11. Furthermore, the tank, the pressure pump, and the filter unit do not all need to be provided to the liquid supply mechanism 10 of the exposure apparatus EX, and at least one of them can be substituted with equipment at, for example, the plant where the exposure apparatus EX is installed.

The liquid recovery mechanism 20 recovers the liquid LQ on the image plane side of the projection optical system PL and comprises: a liquid recovery section 21 that is capable of recovering the liquid LQ; and a recovery pipe 23, one end portion of which is connected to the liquid recovery section 21. The other end portion of the recovery pipe 23 is connected to the nozzle member 70. An internal passageway (recovery passageway) that connects the recovery ports 22 with the other end portion of the recovery pipe 23 is formed inside the nozzle member 70. The liquid recovery section 21 is provided with, for example: a vacuum system (a suction apparatus) such as a vacuum pump; a gas-liquid separator that separates the recovered liquid LQ and gas; and a tank that stores the recovered liquid LQ. Furthermore, the tank, the vacuum system, and the gas-liquid separator do not all need to be provided to the liquid recovery mechanism 20 of the exposure apparatus EX, and at least one of them can be substituted with equipment at, for example, the plant where the exposure apparatus EX is installed.

The supply ports 12, which supply the liquid LQ, and the recovery ports 22, which recover the liquid LQ, are formed in a lower surface 70A of the nozzle member 70. The lower surface 70A of the nozzle member 70 is provided at a position that opposes the upper surface of the substrate P and the upper surfaces F1, F2 of the stages ST1, ST2. The nozzle member 70 is an annular member that is provided so that it surrounds a side surface of the first optical element LS1, and a plurality of the supply ports 12 are provided in the lower surface 70A of the nozzle member 70 so that it surrounds the first optical element LS1 of the projection optical system PL (the optical axis AX of the projection optical system PL). In addition, the recovery ports 22 are provided in the lower surface 70A of the nozzle member 70 spaced apart from the outer side of the supply ports 12 with respect to the first optical element LS1, and are provided so that they surround the first optical element LS1 and the supply ports 12.

Furthermore, the control apparatus CONT locally forms the liquid immersion region LR of the liquid LQ on the substrate P by using the liquid supply mechanism 10 to supply a prescribed amount of the liquid LQ onto the substrate P, and by using the liquid recovery mechanism 20 to recover a prescribed amount of the liquid LQ on the substrate P. When forming the liquid immersion region LR of the liquid LQ, the control apparatus CONT drives the liquid supply section 11 and the liquid recovery section 21. When the liquid LQ is sent from the liquid supply section 11 under the control of the control apparatus CONT, the liquid LQ sent from the liquid supply section 11 flows through the supply pipe 13 and then is supplied through the supply passageway of the nozzle member 70 to the image plane side of the projection optical system PL from the supply ports 12. In addition, when the liquid recovery section 21 is driven under the control of the control apparatus CONT, the liquid LQ on the image plane side of the projection optical system PL flows into the recovery passageway of the nozzle member 70 through the recovery ports 22, flows through the recovery pipe 23, and is then collected by the liquid recovery section 21.

Figure 2:
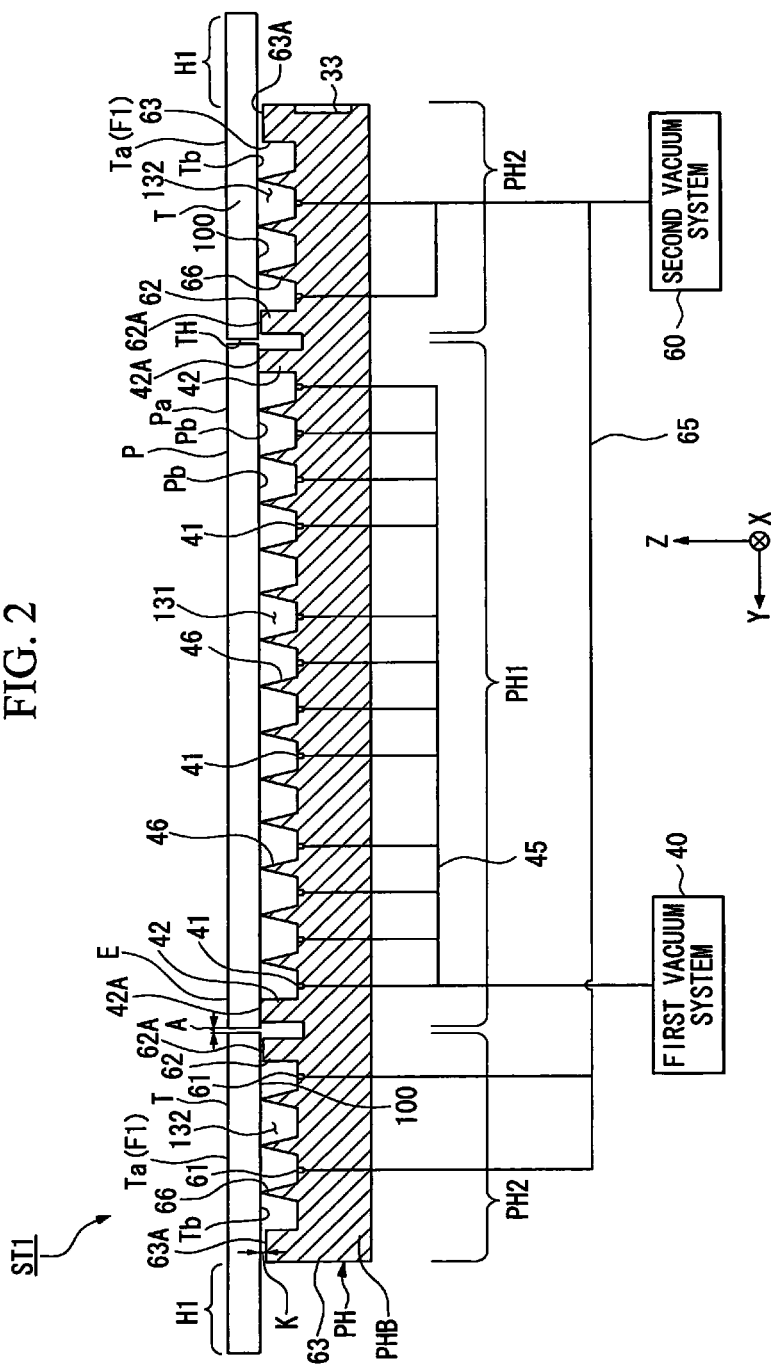
FIG. 2 is a cross sectional view of a substrate stage.
Figure 3:
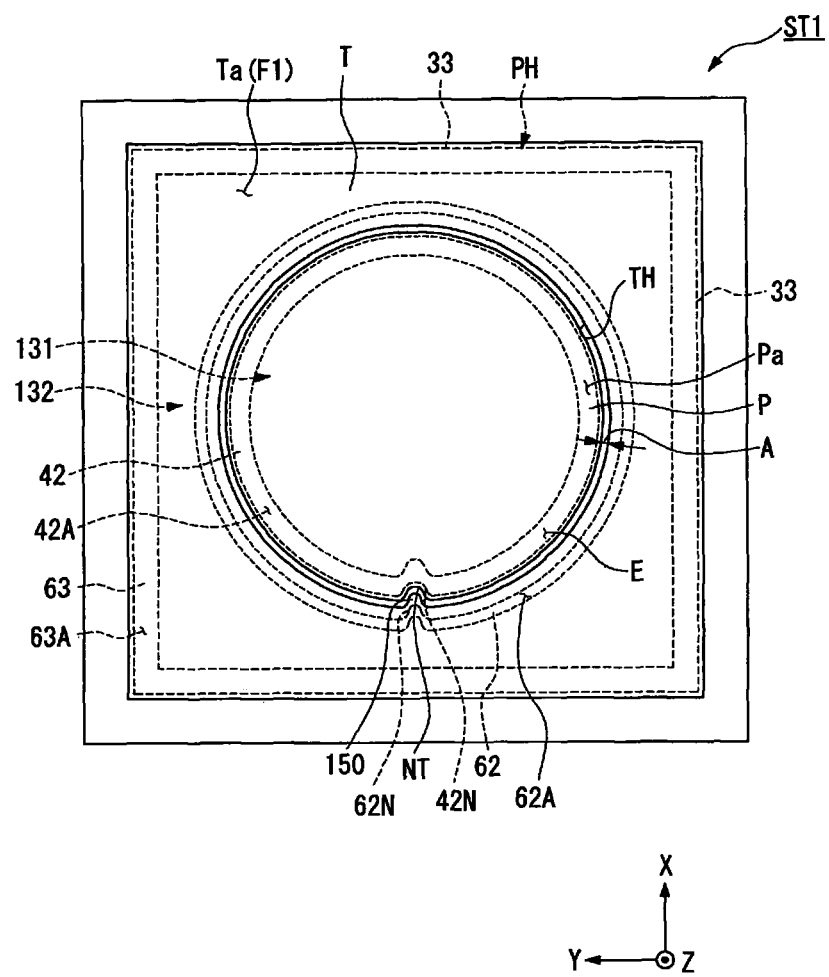
FIG. 3 is a plan view of the substrate stage.

The following explains the substrate stage ST1 (substrate holder PH), referencing FIG. 2 and FIG. 3. FIG. 2 is a side cross sectional view of the substrate holder PH in a state wherein the substrate P and the plate member T are vacuum chucked, and FIG. 3 is a plan view of the substrate stage ST1 viewed from above.

In FIG. 2, the substrate holder PH comprises a base material PHB, a first holding portion PH1, which is formed in the base material PHB and vacuum chucks the substrate P, and a second holding portion PH2, which is formed in the base material PHB and detachably holds the plate member T, wherein an upper surface Ta is formed that is substantially flush with an upper surface Pa of the substrate P, at the circumference of the substrate P held by the first holding portion PH1. The plate member T is different from the base material PHB, and is provided so that it can be detached (i.e., it is replaceable) from the base material PHB of the substrate holder PH. In addition, as shown in FIG. 3, the plate member T is a substantially annular member, and a substantially circular hole TH, wherein the substrate P can be disposed, is formed at the center portion thereof. Furthermore, the plate member T held by the second holding portion PH2 is disposed so that it surrounds the circumference of the substrate P that is held by the first holding portion PH1. In the present embodiment, the substrate stage ST1 refers to the state wherein the plate member T is vacuum chucked to the base material PHB.

The plate member T is liquid repellent with respect to the liquid LQ. The plate member T is made of a liquid repellent material, for example, a fluororesin such as polytetrafluoroethylene (Teflon™), or an acrylic resin. Furthermore, the plate member T may be made of, for example, a metal and its surface may be coated with a liquid repellent material such as a fluororesin.

In FIG. 2, the upper surface Ta and a lower surface Tb of the plate member T are each a flat surface (flat portion). In addition, the plate member T has substantially the same thickness as the substrate P. Furthermore, the upper surface (flat surface) Ta of the plate member T that is held by the second holding portion PH2 is substantially flush with the upper surface Pa of the substrate P that is held by the first holding portion PH1. Namely, at the circumference of the substrate P that is held by the first holding portion PH1, the plate member T that is held by the second holding portion PH2 forms the flat surface Ta, which is substantially flush with the upper surface Pa of that substrate P. In the present embodiment, the upper surface of the substrate stage ST1 is formed so that, when the substrate P is held thereon, the substantially entire area of that upper surface of the substrate stage ST1, including the upper surface Pa of the held substrate P, forms a flat surface (full flat surface).

The external form of the plate member T is rectangular in a plan view, and is formed so that it is larger than the external form of the base material PHB. Namely, a peripheral edge portion of the plate member T that is held by the second holding portion PH2 forms the overhanging portion (protruding portion) H1, which projects from the side surface to the outer side of the base material PHB. The area of the overhanging portion H1 on the +Y side forms a protruding portion that projects toward the measurement stage ST2. In the present embodiment, the upper surface Ta of the plate member T, which includes the upper surface of the overhanging portion H1, forms the upper surface F1 of the substrate stage ST1. Furthermore, the area of the upper surface F1 of the substrate stage ST1 on the +Y side, i.e., the +Y side upper surface F1 (Ta) of the overhanging portion H1, and the area of the upper surface F2 of the measurement stage ST2 on the −Y side are proximate to or in contact with one another.

In the present embodiment, the movable mirrors 33 are provided in an area below the overhanging portion H1. Thereby, even if the liquid LQ flows out from the upper surface F1 (Ta), the overhanging portion H1 can prevent the liquid LQ from adhering to the movable mirrors 33.

As shown in FIG. 2 and FIG. 3, the first holding portion PH1 of the substrate holder PH comprises protruding first support portions 46, which are formed on the base material PHB, and an annular first circumferential wall portion 42, which is formed on the base material PHB so that it surrounds the first support portions 46. The first support portions 46 support a lower surface Pb of the substrate P, and a plurality of first support portions 46 are uniformly formed on the inner side of the first circumferential wall portion 42. In the present embodiment, the first support portions 46 comprise a plurality of support pins. In accordance with the shape of the substrate P, the first circumferential wall portion 42 is formed substantially annular in a plan view, and an upper surface 42A of the first circumferential wall portion 42 is formed so that it opposes a circumferential edge area (edge area) of the lower surface Pb of the substrate P. A first space 131, which is surrounded by the base material PHB, the first circumferential wall portion 42, and the lower surface Pb of the substrate P, is formed on the lower surface Pb side of the substrate P held by the first holding portion PH1.

First suction ports 41 are formed on the base material PHB on the inner side of the first circumferential wall portion 42. The first suction ports 41 are for vacuum chucking the substrate P, and a plurality of first suction ports 41 are provided at prescribed positions on the upper surface of the base material PHB, excluding the areas where the first support portions 46 are provided, on the inner side of the first circumferential wall portion 42. In the present embodiment, the plurality of first suction ports 41 are uniformly disposed on the inner side of the first circumferential wall portion 42. Each first suction port 41 is connected to a first vacuum system 40 through a passageway 45. The first vacuum system 40 is for negatively pressurizing the first space 131, which is surrounded by the base material PHB, the first circumferential wall portion 42, and the lower surface Pb of the substrate P, and includes a vacuum pump. As discussed above, the first support portions 46 comprise support pins, and the first holding portion PH1 according to the present embodiment constitutes one part of a so-called pin chuck mechanism. The first circumferential wall portion 42 functions as an outer wall portion that surrounds the outer side of the first space 131, which includes the first support portions 46, and the control apparatus CONT vacuum chucks the substrate P to the first support portions 46 by driving the first vacuum system 40 so that it suctions gas (air) out of the interior of the first space 131 that is surrounded by the base material PHB, the first circumferential wall portion 42, and the substrate P, thereby negatively pressurizing the first space 131.

The second holding portion PH2 of the substrate holder PH comprises a substantially annular second circumferential wall portion 62, which is formed on the base material PHB so that it surrounds the first circumferential wall portion 42 of the first holding portion PH1, an annular third circumferential wall portion 63, which is provided on the outer side of the second circumferential wall portion 62 and is formed on the base material PHB so that it surrounds the second circumferential wall portion 62, and protruding second support portions 66, which are formed on the base material PHB between the second circumferential wall portion 62 and the third circumferential wall portion 63. The second support portions 66 support the lower surface Tb of the plate member T, and a plurality of second support portions 66 are uniformly formed between the second circumferential wall portion 62 and the third circumferential wall portion 63. Like the first support portions 46, the second support portions 66 in the present embodiment comprise a plurality of support pins. The second circumferential wall portion 62 is provided on the outer side of the first circumferential wall portion 42 with respect to the first space 131, and the third circumferential wall portion 63 is provided farther on the outer side of the second circumferential wall portion 62 with respect to the first space 131. In addition, the second circumferential wall portion 62 is formed in accordance with the shape of the hole TH of the plate member T so that it is substantially annular in a plan view. The third circumferential wall portion 63 is formed substantially rectangular in a plan view on the inner side of an edge portion on the outer side of the plate member T. An upper surface 62A of the second circumferential wall portion 62 is formed so that it opposes an inner edge area (an inner side edge area) of the lower surface Tb of the plate member T in the vicinity of the hole TH. An upper surface 63A of the third circumferential wall portion 63 is formed so that it opposes an area of the lower surface Tb of the plate member T that is slightly on the inner side of the outer edge area (the outer side edge area). A second space 132, which is surrounded by the base material PHB, the second and third circumferential wall portions 62, 63, and the lower surface Tb of the plate member T, is formed on the lower surface Tb side of the plate member T held by the second holding portion PH2.

Second suction ports 61 are formed on the base material PHB between the second circumferential wall portion 62 and the third circumferential wall portion 63. The second suction ports 61 are for vacuum chucking the plate member T, and a plurality of the second suction ports 61 are provided between the second circumferential wall portion 62 and the third circumferential wall portion 63 at prescribed positions on the upper surface of the base material PHB, excluding the areas of the second support portions 66. In the present embodiment, the plurality of second suction ports 61 are uniformly disposed between the second circumferential wall portion 62 and the third circumferential wall portion 63.

Each of the second suction ports 61 is connected to a second vacuum system 60 through a passageway 65. The second vacuum system 60 is for negatively pressurizing the second space 132, which is surrounded by the base material PHB, the second and third circumferential wall portions 62, 63, and the lower surface Tb of the plate member T, and includes a vacuum pump. As discussed above, the second support portions 66 comprise support pins, and, like the first holding portion PH1, the second holding portion PH2 according to the present embodiment constitutes one part of the so-called pin chuck mechanism. The second and third circumferential wall portions 62, 63 function as outer wall portions that enclose the outer sides of the second space 132, which includes the second support portions 66, and the control apparatus CONT vacuum chucks the plate member T to the second support portions 66 by driving the second vacuum system 60 so as to suction the gas (air) out of the interior of the second space 132 that is surrounded by the base material PHB, the second and third circumferential wall portions 62, 63, and the plate member T, thereby negatively pressurizing the second space 132.

Furthermore, although a pin chuck mechanism is employed when vacuum chucking the substrate P in the present embodiment, other chuck mechanisms may be employed. Likewise, although a pin chuck mechanism is employed when vacuum chucking the plate member T, other chuck mechanisms may be employed. In addition, although vacuum chuck mechanisms are employed when vacuum chucking the substrate P and the plate member T in the present embodiment, at least one of them may use another mechanism such as an electrostatic chuck mechanism.

The first vacuum system 40 that negatively pressurizes the first space 131 and the second vacuum system 60 that negatively pressurizes the second space 132 are mutually independent. The control apparatus CONT can separately control the operation of the first vacuum system 40 and the second vacuum system 60, and the operation of suctioning the first space 131 by the first vacuum system 40 and the operation of suctioning the second space 132 by the second vacuum system 60 can be performed independently. In addition, the control apparatus CONT controls the first vacuum system 40 and the second vacuum system 60, and can make the pressure of the first space 131 and the pressure of the second space 132 different from one another.

As shown in FIG. 2 and FIG. 3, a gap A of approximately 0.1-1.0 mm is formed between the edge portion on the outer side of the substrate P held by the first holding portion PH1 and the edge portion on the inner side (hole TH side) of the plate member T provided at the circumference of the substrate P. In the present embodiment, the gap A is approximately 0.3 mm. In addition, as shown in FIG. 3, a notched portion NT, which is a notch for alignment, is formed in the substrate P in the present embodiment. The shape of the plate member T is set in accordance with the external form (shape of the notched portion NT) of the substrate P so that the gap in the notched portion NT between the substrate P and the plate member T is also approximately 0.1 to 1.0 mm. Specifically, a projection portion 150 that projects toward the inner side of the hole TH is provided to the plate member T so that it corresponds to the shape of the notched portion NT of the substrate P. Thereby, the gap A of approximately 0.1 to 1.0 mm is secured between the plate member T and the entire area of the edge portion of the substrate P, which includes the notched portion NT. In addition, a protruding portion 62N that corresponds to the shape of the projection portion 150 of the plate member T is formed in the second circumferential wall portion 62 of the second holding portion PH2 and its upper surface 62A. In addition, a recessed portion 42N that corresponds to the shape of the protruding portion 62N of the second circumferential wall portion 62 and the notched portion NT of the substrate P is formed in the first circumferential wall portion 42 of the first holding portion PH1 and its upper surface 42A. The recessed portion 42N of the first circumferential wall portion 42 is provided at a position that opposes the protruding portion 62N of the second circumferential wall portion 62, and a prescribed gap is formed between the recessed portion 42N and the protruding portion 62N.

Furthermore, although the above explained an example of using the notched portion NT as the notch of the substrate P, the prescribed gap A between the substrate P and the plate member T that surrounds such may be secured in cases such as when there is no notch, or when an orientation flat portion is formed in the substrate P as the notch by shaping the plate member T, the first circumferential wall portion 42, and the second circumferential wall portion 62 in accordance with the external form of the substrate P.

Figure 4:
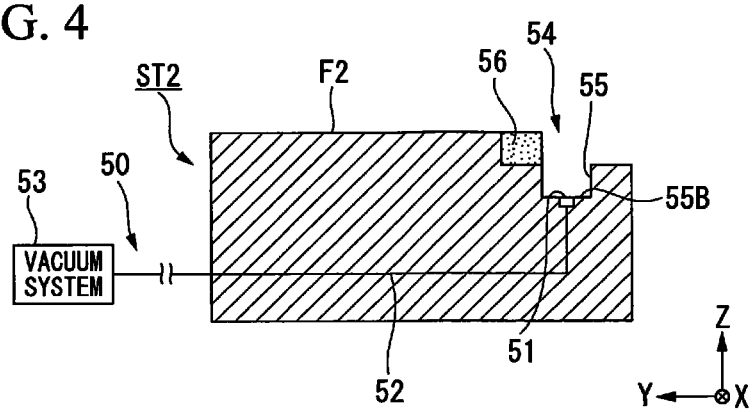
FIG. 4 is a cross sectional view of a measurement stage.
Figure 5:
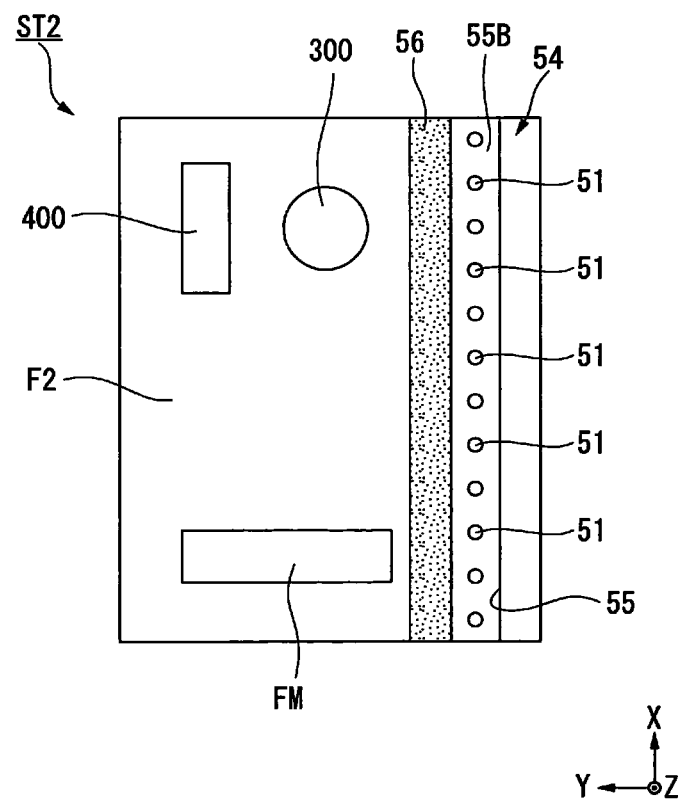
FIG. 5 is a plan view of the measurement stage.

The following explains the measurement stage ST2, referencing FIG. 4 and FIG. 5. As discussed above, the measurement stage ST2 mounts the measuring instruments that perform measurements related to the exposure process, and its upper surface F2 forms a flat surface. In FIG. 5, a fiducial mark plate FM wherein a plurality of fiducial marks are formed, a nonuniformity sensor 300, and an aerial image measuring sensor 400 are schematically shown as examples of measuring instruments (measuring members).

The measurement stage ST2 comprises a recovery mechanism 50 that is capable of recovering the liquid LQ. The recovery mechanism 50 comprises the recovery ports 51, which are provided to the measurement stage ST2 and are capable of recovering the liquid LQ, and a passageway 52, which is connected to those recovery ports 51 and to a vacuum system 53. Furthermore, a gas-liquid separator (not shown) that separates gas from the recovered liquid LQ is provided along the passageway 52 between the recovery ports 51 and the vacuum system 53. The recovery mechanism 50 is capable of recovering the liquid LQ through the recovery ports 51 by the drive of the vacuum system 53. The liquid LQ recovered by the recovery ports 51 flows through the passageway 52 and then is stored in a tank (not shown).

The measurement stage ST2 comprises a recessed portion 54 that corresponds to the overhanging portion H1 of the substrate stage ST1. The recessed portion 54 is formed in an area (−Y side area) of the upper surface of the measurement stage ST2 that is proximate to or in contact with the substrate stage ST1, and is formed as a notch in one part of the upper surface F2 of the measurement stage ST2 on the −Y side. Furthermore, a groove portion 55, which extends in the X axial directions, is formed on the inner side of the recessed portion 54 of the measurement stage ST2. The recovery ports 51 are provided in the groove portion 55 formed in the recessed portion 54. As shown in FIG. 5, the recovery ports 51 are substantially circular in a plan view, and a plurality thereof are provided lined up in the X axial directions in a bottom surface 55B of the groove portion 55. Furthermore, each of the plurality of recovery ports 51 is connected to the vacuum system 53 through the passageway 52. Here, the bottom surface 55B of the groove portion 55 is a flat surface that faces the +Z side.

The recessed portion 54 (groove portion 55) is formed in the area (−Y side area) of the upper surface of the measurement stage ST2 that is proximate to or in contact with the substrate stage ST1, and therefore the recovery ports 51, which are formed on the inner side of that recessed portion 54 (groove portion 55), are provided in the vicinity of the area of the measurement stage ST2 that is proximate to or in contact with the substrate stage ST1.

An area of the upper surface F2 of the measurement stage ST2 that is proximate to or in contact with the overhanging portion H1 of the substrate stage ST1 (plate member T) is formed by a liquid repellent member 56. The liquid repellent member 56 may be made of a material, for example a fluororesin such as polytetrafluoroethylene (Teflon™), or an acrylic resin, that is liquid repellent with respect to the liquid LQ. In addition, the liquid repellent member 56 also forms a wall surface that faces the −Y side of the inner edge area of the recessed portion 54. The liquid repellent member 56 is detachable from the measurement stage ST2 (i.e., it is replaceable).

FIG. 6 is a plan view of the substrate stage ST1 and the measurement stage ST2, viewed from above. In FIG. 6, the drive mechanism SD comprises linear motors 80, 81, 82, 83, 84, 85 for driving the substrate stage ST1 and the measurement stage ST2. The drive mechanism SD comprises a pair of Y axis linear guides 91, 93 that each extend in the Y axial directions. The Y axis linear guides 91, 93 are disposed spaced apart by a prescribed spacing in the X axial directions. Each of the Y axis linear guides 91, 93 comprises a magnet unit with a built-in permanent magnet group that consists of multiple sets of north pole magnets and south pole magnets that are disposed alternately and at prescribed intervals along, for example, the Y axial directions. Moreover, two sliders 90, 94 are supported on the Y axis linear guide 91 so that they are movable in the Y axial directions in a noncontactual state. Likewise, two sliders 92, 95 are supported on the other Y axis linear guide 93 so that they are movable in the Y axial directions in a noncontactual state. Each of the sliders 90, 92, 94, 95 comprises a coil unit with built-in armature coils disposed at prescribed intervals along, for example, the Y axis. Namely, in the present embodiment, the sliders 90, 94, which each comprise a coil unit, and the Y axis linear guide 91, which comprises a magnet unit, constitute the moving coil type Y axis linear motors 82, 84. Likewise, the sliders 92, 95 and the Y axis linear guide 93 constitute the moving coil type Y axis linear motors 83, 85.

One end portion and the other end portion of each of the sliders 90, 92, which constitute the Y axis linear motors 82, 83, are fixed in the longitudinal direction of an X axis linear guide 87, which extends in the X axial directions. In addition, one end portion and the other end portion of each of the sliders 94, 95, which constitute the Y axis linear motors 84, 85, are fixed in the longitudinal direction of an X axis linear guide 89, which extends in the X axial directions. Accordingly, the X axis linear guide 87 is movable in the Y axial directions by the Y axis linear motors 82, 83, and the X axis linear guide 89 is movable in the Y axial directions by the Y axis linear motors 84, 85.

The X axis linear guides 87, 89 each comprise a coil unit that has built-in armature coils, which, for example, are disposed at prescribed intervals along the X axial directions. The X axis linear guide 89 is provided in a state wherein it is inserted in an opening that is formed in the substrate stage ST1. A magnet unit 88, which comprises a permanent magnet group that consists of multiple sets of north pole magnets and south pole magnets disposed alternately and at prescribed intervals along, for example, the X axial directions, is provided in the inner portion of the opening of the substrate stage ST1. The magnet unit 88 and the X axis linear guide 89 constitute the moving magnet type X axis linear motor 81 that drives the substrate stage ST1 in the X axial directions. Likewise, the X axis linear guide 87 is provided in a state wherein it is inserted in an opening formed in the measurement stage ST2. A magnet unit 86 is provided the opening of the measurement stage ST2. The magnet unit 86 and the X axis linear guide 87 constitute the moving magnet type X axis linear motor 80 that drives the measurement stage ST2 in the X axial directions.

Furthermore, making the thrust generated by each of the two Y axis linear motors 84, 85 (or 82, 83) slightly different makes it possible to control the substrate stage ST1 (or the measurement stage ST2) in the θZ directions. In addition, the substrate stage ST1 and the measurement stage ST2 are each shown in the drawings as single stages, but they each actually comprise an XY stage, which is driven by its respective Y axis linear motor, and a Z tilt stage, which is mounted to an upper portion of the XY stage via a Z leveling drive mechanism (e.g., a voice coil motor) and is finely driven relative to the Z axial directions and the θX and θY directions with respect to the XY stage. Furthermore, the substrate holder PH (refer to FIG. 1), which holds the substrate P, is supported by the Z tilt stage.

The following explains a parallel process operation that uses the substrate stage ST1 and the measurement stage ST2, referencing FIG. 6 through FIG. 8B.

As shown in FIG. 6, when performing immersion exposure of the substrate P, the control apparatus CONT makes the measurement stage ST2 stand by at a prescribed stand-by position where it will not collide with the substrate stage ST1. Furthermore, in a state wherein the substrate stage ST1 and the measurement stage ST2 are spaced apart, the control apparatus CONT performs a step-and-scan type immersion exposure of the substrate P, which is held by the substrate stage ST1. When performing the immersion exposure of the substrate P, the control apparatus CONT uses the liquid immersion mechanism 1 to form the liquid immersion region LR of the liquid LQ on the substrate stage ST1.

After completing the immersion exposure of the substrate P on the substrate stage ST1, the control apparatus CONT uses the drive mechanism SD to drive at least one of the substrate stage ST1 and the measurement stage ST2, and, as shown in FIG. 7A, causes the upper surface F2 of the measurement stage ST2 to be in contact with (or proximate to) the upper surface F1 of the substrate stage ST1. In greater detail, the linear edge of the upper surface F1 (plate member T) of the substrate stage ST1 on the +Y side and the linear edge of the upper surface F2 (liquid repellent member 56) of the measurement stage ST2 on the −Y side are caused to be in contact with (or proximate to) one another.

Next, the control apparatus CONT uses the drive mechanism SD to simultaneously move the substrate stage ST1 and the measurement stage ST2 in the −Y direction, while maintaining the relative positional relationship of the substrate stage ST1 and the measurement stage ST2 in the Y axial directions. Namely, while maintaining a prescribed state wherein the upper surface F1 of the substrate stage ST1 and the upper surface F2 of the measurement stage ST2 contact (or are proximate to) one another, the control apparatus CONT moves them together in the −Y direction within a prescribed area that includes a position that is directly below the projection optical system PL.

By moving the substrate stage ST1 and the measurement stage ST2 together, the control apparatus CONT moves the liquid LQ, which is retained between the substrate P and the first optical element LS1 of the projection optical system PL, from the upper surface F1 of the substrate stage ST1 to the upper surface F2 of the measurement stage ST2. With the movement of the substrate stage ST1 and the measurement stage ST2 in the −Y direction, the liquid immersion region LR of the liquid LQ, which is formed between the substrate P and the first optical element LS1 of the projection optical system PL, moves to the upper surface of the substrate P, the upper surface F1 of the substrate stage ST1, and the upper surface F2 of the measurement stage ST2, in that order. Furthermore, along the way of moving from the upper surface F1 of the substrate stage ST1 to the upper surface F2 of the measurement stage ST2, the liquid immersion region LR of the liquid LQ spans the upper surface F1 of the substrate stage ST1 and the upper surface F2 of the measurement stage ST2, as shown in FIG. 7B.

When the substrate stage ST1 and the measurement stage ST2 further move together a prescribed distance in the −Y direction from the state shown in FIG. 7B, they transition to a state wherein the liquid LQ is held between the measurement stage ST2 and the first optical element LS1 of the projection optical system PL, as shown in FIG. 8A. Namely, the liquid immersion region LR of the liquid LQ is disposed on the upper surface F2 of the measurement stage ST2.

Next, the control apparatus CONT uses the drive mechanism SD to move the substrate stage ST1 to a prescribed substrate exchange position and exchanges the substrate P. In addition, in parallel therewith, prescribed measurement processes that use the measurement stage ST2 are performed as needed. An example of such a measurement process is the baseline measurement of the alignment system ALG. Specifically, the control apparatus CONT uses the mask alignment systems RAa, RAb, which were discussed above, to simultaneously detect a pair of first fiducial marks on the fiducial mark plate FM that is provided on the measurement stage ST2 and corresponding mask alignment marks on the mask M, and thereby detects the positional relationship between the first fiducial marks and the corresponding mask alignment marks. Simultaneous therewith, by detecting a second fiducial mark on the fiducial mark plate FM with the alignment system ALG, the control apparatus CONT detects the positional relationship between the second fiducial mark and a detection reference position of the alignment system ALG. Furthermore, based on the positional relationship between the above-mentioned first fiducial marks and the corresponding mask alignment marks, the positional relationship between the second fiducial mark and the detection reference position of the alignment system ALG, and the already known positional relationship between the first fiducial marks and the second fiducial mark, the control apparatus CONT derives the distance (positional relationship) between the center of the projection of the mask pattern projected by the projection optical system PL and the detection reference position of the alignment system ALG, i.e., it derives baseline information of the alignment system ALG FIG. 8B shows the state at this time.

Furthermore, the detection of the first fiducial marks by the mask alignment system and the detection of the second fiducial mark by the alignment system ALG do not necessarily need to be performed simultaneously, and may be performed in a sequential time series; in addition, the position of the measurement stage ST2 when detecting the first fiducial marks and the position of the measurement stage ST2 when detecting the second fiducial mark may be different.

Furthermore, after completing the process discussed above on both stages ST1, ST2, the control apparatus CONT performs the alignment process on the exchanged substrate P by, for example, causing the upper surface F2 of the measurement stage ST2 and the upper surface F1 of the substrate stage ST1 to be in contact with (or proximate to) one another and, in a state wherein that relative positional relationship is maintained, moves them within the XY plane. Specifically, the control apparatus CONT uses the alignment system ALG to detect the alignment marks on the exchanged substrate P and determines the positional coordinates (array coordinates) of each of the plurality of shot regions provided on the substrate P.

Subsequently, in the reverse sequence of that described earlier, the control apparatus CONT moves both stages ST1, ST2 together in the +Y direction while maintaining the relative positional relationship of the substrate stage ST1 and the measurement stage ST2 in the Y axial directions, and, after moving the substrate stage ST1 (substrate P) to below the projection optical system PL, retracts the measurement stage ST2 to a prescribed position. Thereby, the liquid immersion region LR is disposed on the upper surface F1 of the substrate stage ST1. Also, when moving the liquid immersion region LR of the liquid LQ from the upper surface F2 of the measurement stage ST2 to the upper surface F1 of the substrate stage ST1, the liquid immersion region LR spans the upper surface F1 of the substrate stage ST1 and the upper surface F2 of the measurement stage ST2.

Subsequently, the control apparatus CONT performs a step-and-scan type immersion exposure operation on the substrate P and sequentially transfers the pattern of the mask M to each of the plurality of shot regions on the substrate P. Furthermore, the alignment of each of the shot regions on the substrate P with the mask M is performed based on the positional coordinates of the plurality of shot regions on the substrate P, which were obtained as a result of the substrate alignment process discussed above, and the baseline information, which was measured immediately beforehand.

Furthermore, the alignment process may be executed in a state wherein the substrate stage ST1 and the measurement stage ST2 are spaced apart, or one part of the alignment process may be executed in a state wherein the substrate stage ST1 and the measurement stage ST2 are spaced apart and the remaining part may be executed in a state wherein the substrate stage ST1 and the measurement stage ST2 are in contact with (or proximate to) one another. In addition, the measurement operation is not limited to the baseline measurement discussed above; for example, the measurement stage ST2 may be used to perform, for example, luminous flux intensity measurement, luminous flux intensity nonuniformity measurement, or aerial image measurement in parallel with, for example, substrate exchange, and the process of, for example, calibrating the projection optical system PL may be performed based on those measurement results, which are taken into account when subsequently exposing the substrate P.

In the present embodiment, after the exposure of one substrate P is complete, it is possible to start the next exposure of another substrate P without going through the process of recovering all of the liquid LQ and then resupplying such, which makes it possible to improve throughput. In addition, various measurement operations are performed at the measurement stage ST2 during the substrate exchange operation with the substrate stage ST1, and those measurement results can be taken into account in the exposure operation of the subsequent substrate P, which makes it possible to perform highly accurate exposure operation without leading to a decline in throughput attendant with the measurement operations. In addition, the liquid LQ is always present on the image plane side of the projection optical system PL, which makes it possible to effectively prevent the occurrence of adhered residue (a so-called watermark) of the liquid LQ.

Figure 9:
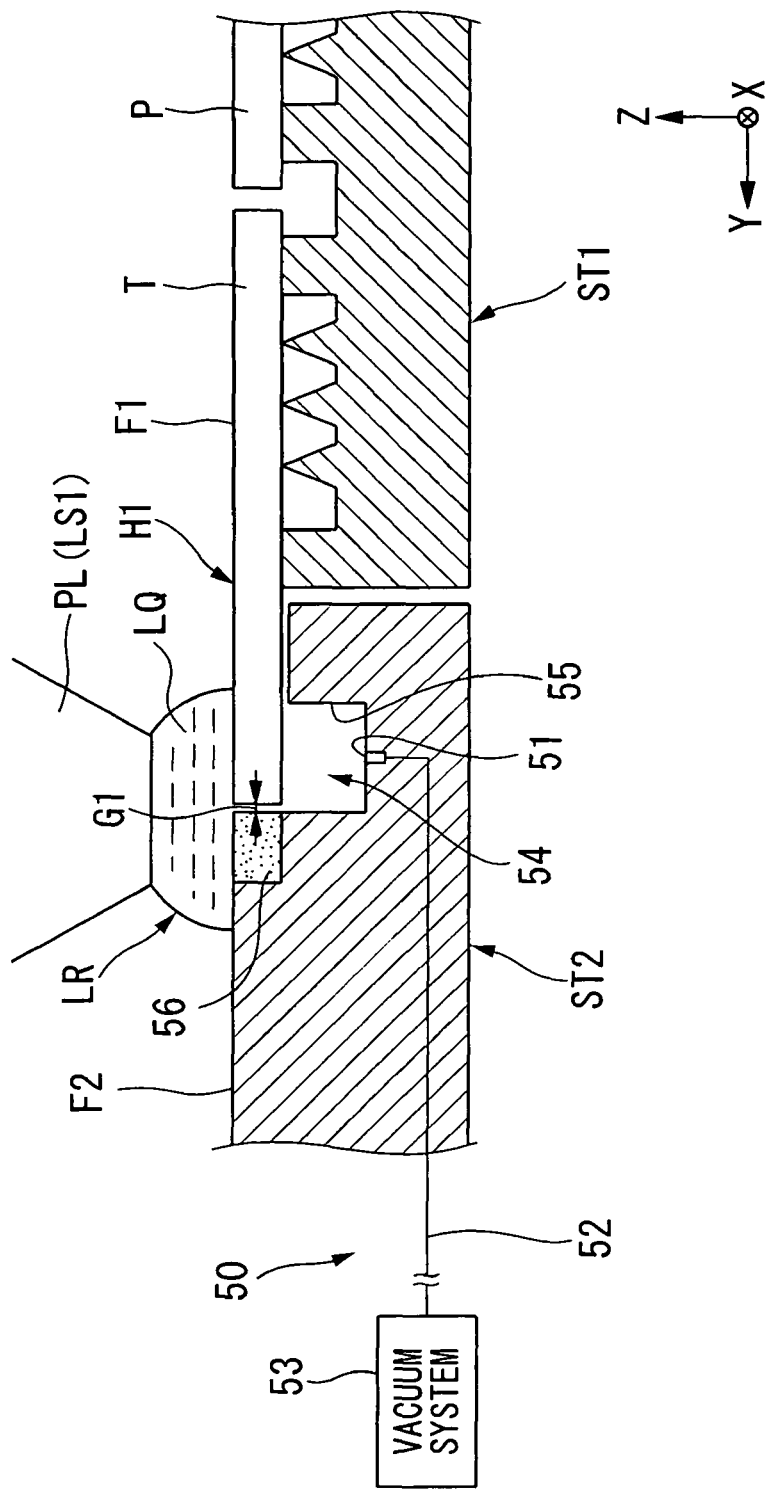
FIG. 9 is for explaining the state wherein the liquid immersion area is moving.

FIG. 9 shows a state wherein the substrate stage ST1 and the measurement stage ST2 are moved together while maintaining a first state wherein the upper surface F1 of the substrate stage ST1 and the upper surface F2 of the measurement stage ST2 are proximate to (or in contact with) one another. When the substrate stage ST1 and the measurement stage ST2 are in the state (first state) shown in FIG. 9, the overhanging portion H1 of the substrate stage ST1 is disposed over the recessed portion 54 of the measurement stage ST2. Thereby, in the first state, the recovery ports 51 provided on the inner side of the recessed portion 54 transition to a state wherein they are closed by the overhanging portion H1. In addition, the vicinity of the areas wherein the upper surface F1 of the substrate stage ST1 and the upper surface F2 of the measurement stage ST2 are mutually proximate to (or in contact with) one another are formed by the plate member T and the liquid repellent member 56, respectively, and are liquid repellent. Accordingly, even if the liquid LQ of the liquid immersion region LR is disposed on a gap G1 between the upper surface F1 of the substrate stage ST1 (plate member T) and the upper surface F2 of the measurement stage ST2 (liquid repellent member 56), the surface tension of the liquid LQ can suppress the occurrence of a problem wherein the liquid LQ leaks out through the gap G1. Furthermore, the plate member T and the liquid repellent member 56 are replaceably provided, which makes it possible to provide the stages ST1, ST2 with a plate member T and a liquid repellent member 56 that are made of a material that has physical properties that are optimal for the type (physical properties) of the liquid LQ used so that the liquid LQ does not leak out from the gap G1. In addition, if the liquid repellency performance of a member deteriorates, it can be replaced.

In addition, in the prescribed state wherein the upper surface F1 of the substrate stage ST1 and upper surface F2 of the measurement stage ST2 are proximate to (or in contact with) one another, the upper surface F1 of the substrate stage ST1 and the upper surface F2 of the measurement stage ST2 are substantially flush with one another, which makes it possible to satisfactorily move the liquid immersion region LR of the liquid LQ between the upper surface F1 of the substrate stage ST1 and the upper surface F2 of the measurement stage ST2.

Furthermore, by moving the substrate stage ST1 and the measurement stage ST2 together in a state wherein the recovery ports 51 are closed by the overhanging portion H1, the control apparatus CONT moves the liquid immersion region LR between the upper surface F1 of the substrate stage ST1 and the upper surface F2 of the measurement stage ST2 in a state wherein the liquid LQ is held between the projection optical system PL and at least one of the upper surface F1 of the substrate stage ST1 and the upper surface F2 of the measurement stage ST2.

In addition, even if the liquid LQ leaks out of the gap G1 when the liquid immersion region LR is moved in the first state, the groove portion 55 is provided on the lower side of the gap G1, and the liquid LQ that leaks out is consequently trapped by the groove portion 55. Accordingly, it is possible to prevent the occurrence of the problem wherein the liquid LQ flows out, for example, to the outer sides of the stages ST1, ST2 or onto the base member BP. In addition, because the recovery ports 51 of the recovery mechanism 50 are provided on the inner side of the groove portion 55, the liquid LQ that leaks out from the gap G1 can be recovered through the recovery ports 51.

Figure 10:
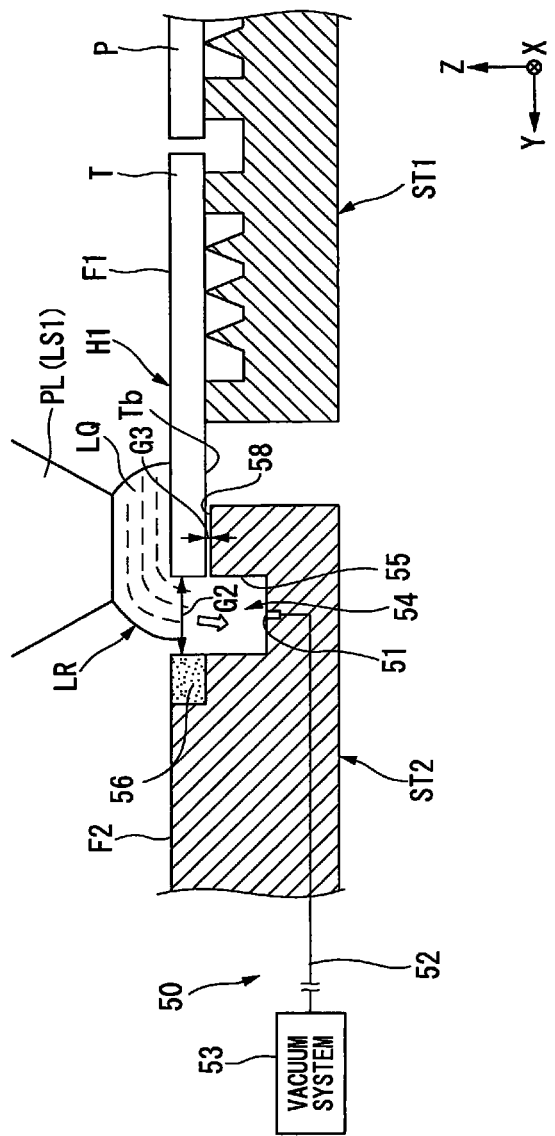
FIG. 10 is for explaining the state wherein the liquid of the liquid immersion area is being recovered.

FIG. 10 shows a state (second state) wherein the liquid LQ is being recovered through the recovery ports 51. For example, in cases when all of the liquid LQ of the liquid immersion region LR is recovered, such as when maintenance of the exposure apparatus EX is performed, the control apparatus CONT sets the relative positional relationship between the substrate stage ST1 and the measurement stage ST2 to the second state shown in FIG. 10, which is different from the first state. Namely, the control apparatus CONT controls the drive of the drive mechanism SD to form a gap G2 between the upper surface F1 of the substrate stage ST1 and the upper surface F2 of the measurement stage ST2, thereby exposing the groove portion 55 and the recovery ports 51 provided on the inner side thereof. At this time, one part of the lower surface Tb of the overhanging portion H1 (plate member T) is disposed so that it overlaps an upper surface 58 above the groove portion 55, which is an area of one part of the recessed portion 54 of the measurement stage ST2. A prescribed gap G3 is formed between the lower surface Tb of the plate member T and the upper surface 58. Furthermore, in the second state wherein the gap G2 is formed between the upper surface F1 of the substrate stage ST1 and the upper surface F2 of the measurement stage ST2 and the recovery ports 51 are exposed, the liquid LQ is recovered by the recovery ports 51 of the measurement stage ST2 while moving the substrate stage ST1 and the measurement stage ST2 together. By moving the substrate stage ST1 and the measurement stage ST2 and disposing the gap G2 below the projection optical system PL, the liquid LQ held below the projection optical system PL flows into the groove portion 55 through the gap G2 by the force of gravity, and is collected through the recovery ports 51. In addition, when the gap G2 is formed and the liquid LQ is being recovered, the prescribed gap G3 formed between the lower surface Tb of the plate member T and the upper surface 58 makes it possible to suppress the flow of the liquid LQ, which flowed in from the gap G2, out through the gap G3 by the surface tension of the liquid LQ. Furthermore, in the state shown in FIG. 10, the recovery mechanism 50 may recover the liquid LQ in a state wherein the substrate stage ST1 and the measurement stage ST2 are stopped.

In addition, control apparatus CONT performs the operation of recovering the liquid LQ via the recovery ports 51 provided to the measurement stage ST2 in parallel with the operation of recovering the liquid via the recovery ports 22 of the nozzle member 70 of the liquid immersion mechanism 1. For example, when the liquid immersion region LR is on the upper surface F1 of the substrate stage ST1 or on the upper surface F2 of the measurement stage ST2, the control apparatus CONT uses the drive mechanism SD to move the stages ST1, ST2 while recovering the liquid LQ via the recovery ports 22 of the nozzle member 70, and thereby moves the liquid immersion region LR to the gap G2. Furthermore, when the liquid LQ of the liquid immersion region LR begins to flow into the groove portion 55 (or before it begins to flow in, or after a prescribed time has elapsed since it began to flow in), the control apparatus CONT drives the recovery mechanism 50 and starts the operation of recovering the liquid LQ via the recovery ports 51 that are provided to the measurement stage ST2. At this time, the operation of recovering the liquid via the recovery ports 22 of the nozzle member 70 of the liquid immersion mechanism 1 continues. The recovery ports 22 of the liquid immersion mechanism 1 recover the liquid LQ from above the measurement stage ST2. The liquid LQ of the liquid immersion region LR flows into the groove portion 55 by the force of gravity, and is recovered by the recovery ports 51 of the measurement stage ST2 and by the recovery ports 22 of the liquid immersion mechanism 1, which are provided above the measurement stage ST2.

As explained above, the recovery ports 51 that are provided to the measurement stage ST2 can satisfactorily recover the liquid LQ. Providing the recovery ports 51 to the measurement stage ST2 disposed on the image plane side of the projection optical system PL makes it possible to rapidly and satisfactorily recover the liquid LQ by the force of gravity. In addition, because the recovery ports 51 are provided to the measurement stage ST2, it is possible to suppress adverse effects upon the substrate stage ST1 when recovering the liquid LQ.

In addition, according to the present embodiment, it is possible to switch between one state, wherein the liquid immersion region LR moves between the upper surface F1 of the substrate stage ST1 and the upper surface F2 of the measurement stage ST2, and another state, wherein the liquid LQ is recovered using the recovery ports 51, merely by changing the relative positional relationship between the substrate stage ST1 and the measurement stage ST2, and it is also possible, with a simple configuration, to rapidly recover the liquid LQ while preventing it from leaking out.

Second Embodiment

Figure 11:
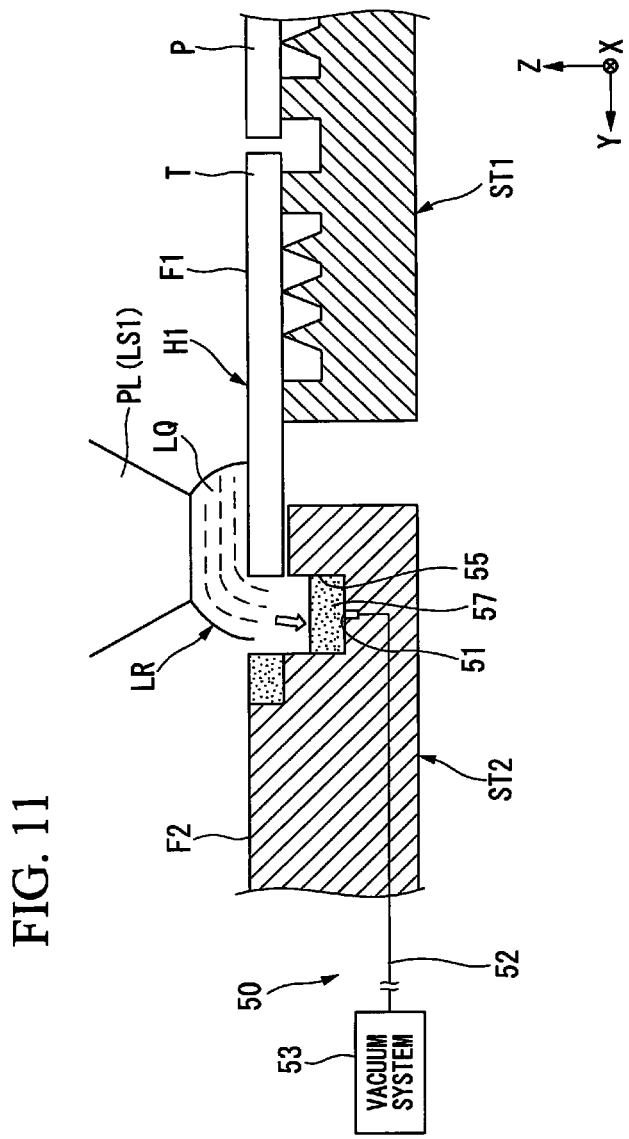
FIG. 11 shows the exposure apparatus according to a second embodiment.

The following explains the second embodiment, referencing FIG. 11. In the explanation below, constituent parts that are identical or equivalent to those in the embodiments discussed above are assigned identical symbols, and the explanations thereof are therefore abbreviated or omitted.

The distinctive feature of the second embodiment is that a liquid recovery member 57 is disposed on the inner side of the groove portion 55. The liquid recovery member 57 is disposed on the recovery ports 51. The liquid recovery member 57 comprises a sponge member that consists of, for example, a ceramic porous member or a synthetic resin. The liquid LQ can be satisfactorily held by disposing the liquid recovery member 57 in this manner. In addition, disposing the liquid recovery member 57 in the groove portion 55 makes it possible to omit the recovery mechanism 50, which includes the recovery ports 51. Because the liquid LQ is held by the liquid recovery member 57 even if the recovery mechanism 50 is omitted, it is possible to prevent the problem wherein the liquid LQ flows out, for example, onto the base member BP. In addition, making the liquid recovery member 57 replaceable makes it possible to replace the one that holds the liquid LQ or a contaminated one with a new one.

Third Embodiment

Figure 12:
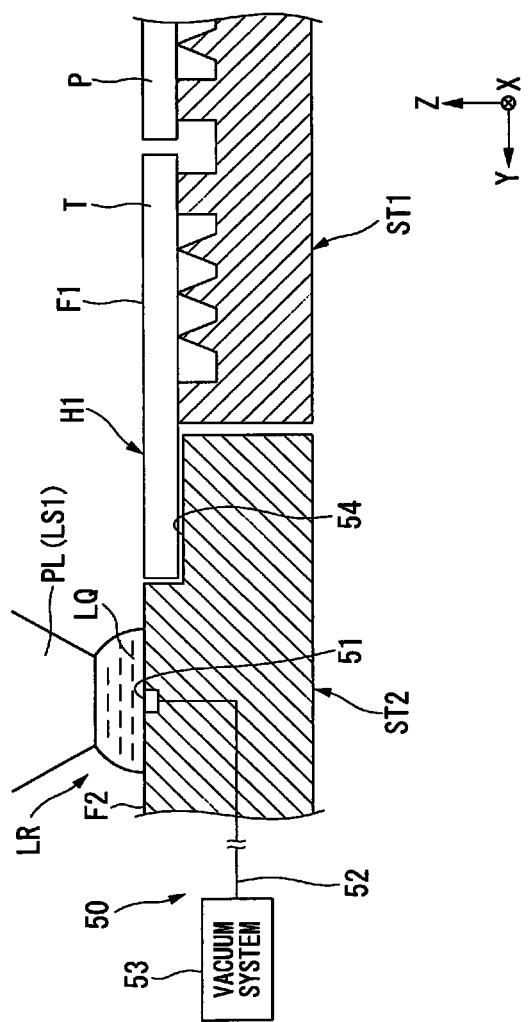
FIG. 12 shows the exposure apparatus according to a third embodiment.

The following explains the third embodiment, referencing FIG. 12. The distinctive feature of the third embodiment is that the recovery ports 51 are provided to the upper surface F2 of the measurement stage ST2. Namely, in the present embodiment, the recovery ports 51 are not formed on the inner side of the recessed portion 54. Furthermore, the recessed portion 54 that corresponds to the overhanging portion H1 of the substrate stage ST1 is formed on the −Y side area of the upper surface of the measurement stage ST2. Furthermore, in the third embodiment as well, a plurality of the recovery ports 51 can be provided along the X directions.

When recovering the liquid LQ, the control apparatus CONT disposes the liquid immersion region LR on the upper surface F2 of the measurement stage ST2 and recovers the liquid LQ through the recovery ports 51 that are formed in that upper surface F2. In the present embodiment, because the recovery ports 51 and the liquid LQ directly contact one another, the liquid LQ can be satisfactorily recovered. Furthermore, in the third embodiment, it is also possible to omit the overhanging portion (protruding portion) H1 of the substrate stage ST1 and the recessed portion 54 of the measurement stage ST2.

Fourth Embodiment

Figure 13:
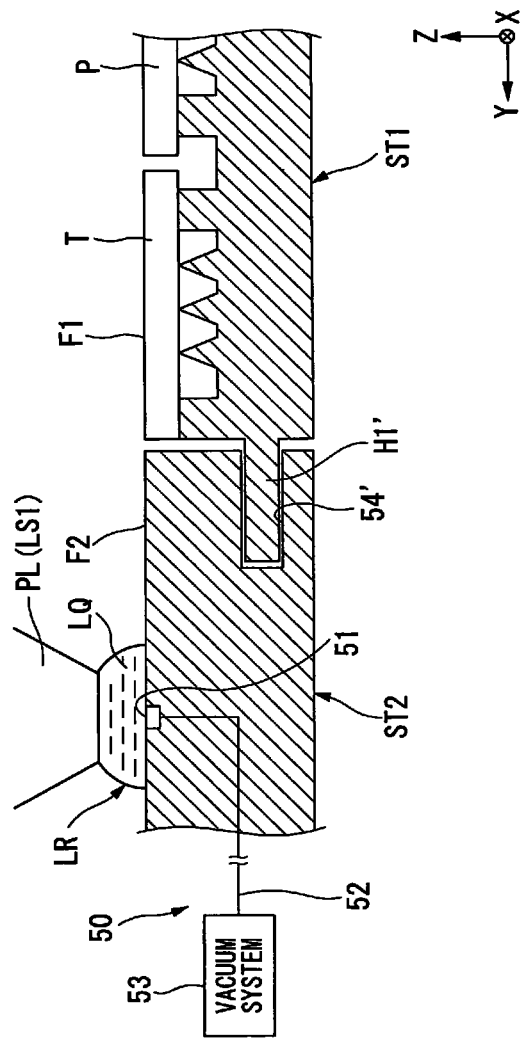
FIG. 13 shows the exposure apparatus according to a fourth embodiment.

The following explains the fourth embodiment, referencing FIG. 13. The distinctive feature of the fourth embodiment is that a protruding portion H1', which projects from the substrate stage ST1 toward the measurement stage ST2, is provided at substantially the center portion of the side surface of the substrate stage ST1 in the Z axial directions. Namely, in the present embodiment, the protruding portion H1' does not form the upper surface F1 of the substrate stage ST1. In addition, a recessed portion 54' that corresponds to the protruding portion H1' is formed in the measurement stage ST2.

Fifth Embodiment

Figure 14:
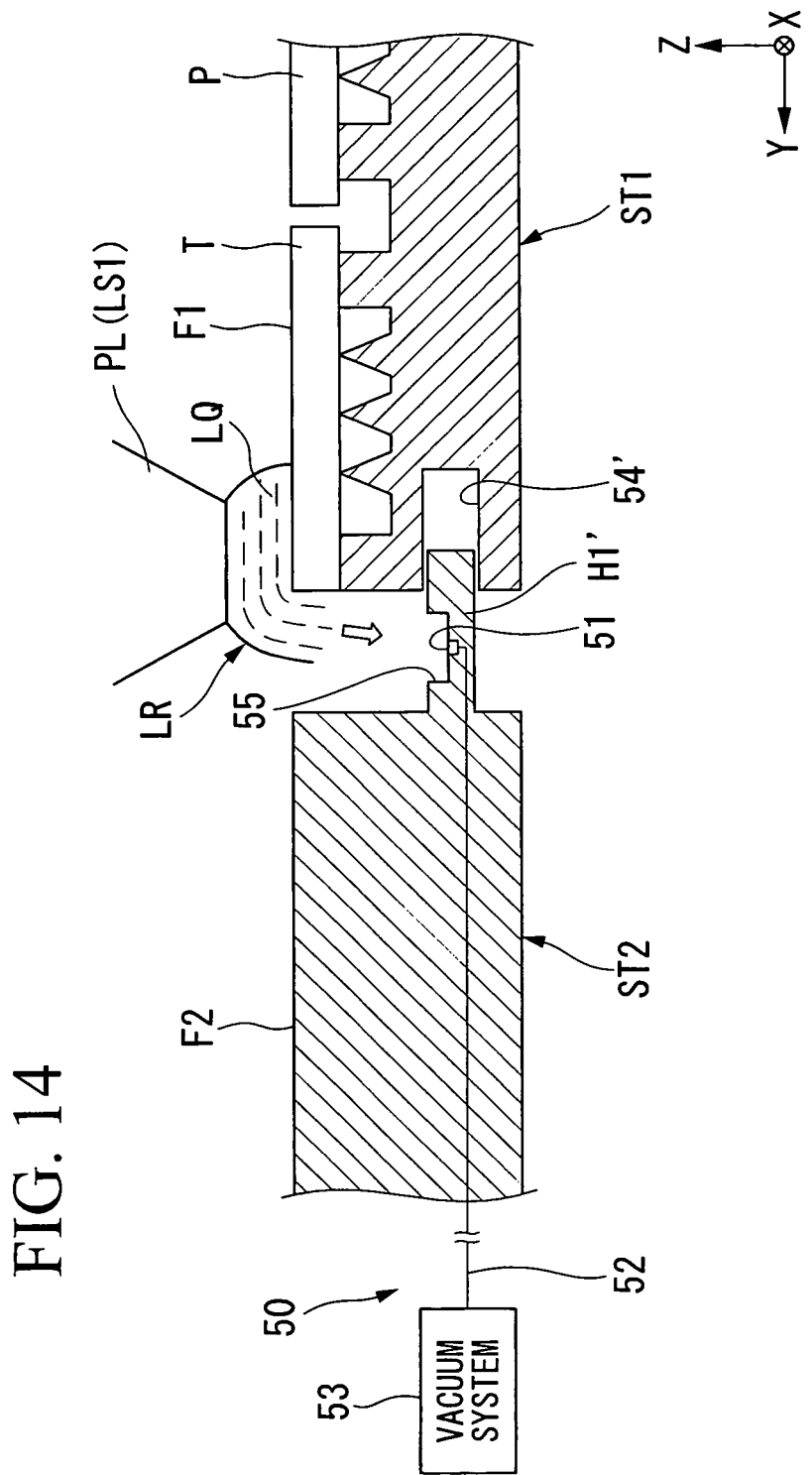
FIG. 14 shows the exposure apparatus according to a fifth embodiment.

FIG. 14 shows the fifth embodiment. As shown in FIG. 14, the protruding portion H1' may be provided at substantially the center portion of the side surface of the measurement stage ST2 in the Z axial directions, and the recessed portion 54' may be provided in the substrate stage ST1. Furthermore, the groove portion 55 may be formed in the protruding portion H1' and the recovery ports 51 may be provided on the inner side of that groove portion 55. In addition, in the present embodiment, when moving the liquid immersion region LR between the upper surface F1 of the substrate stage ST1 and the upper surface F2 of the measurement stage ST2, the substrate stage ST1 and the measurement stage ST2 may approach one another and the protruding portion H1' may be disposed on the inner side of the recessed portion 54'.

Furthermore, in the second through fifth embodiments discussed above, it is also possible to jointly use the recovery ports 22 of the liquid immersion mechanism 1 when recovering all of the liquid LQ.

In addition, in the first and second embodiments discussed above, the groove portion 55 of the measurement stage ST2 is continuously formed from one end to the other end of the measurement stage ST2 in the X axial directions, but may be provided at just one part in the X axial directions, or may be discontinuously formed.

In addition, in the first and fifth embodiments discussed above, the recovery ports 51 are disposed in the bottom surface of the groove portion 55, but, instead of forming the recovery ports, at least one thin tube that has micropores that form the recovery ports may be disposed inside the groove portion 55. In this case, the thin tube itself constitutes one part of the passageway 52.

In addition, in the first, second and fifth embodiments discussed above, the bottom surface of the groove portion 55 is a flat surface, but it may be inclined with respect to the XY plane. In this case, at least one recovery port 51 may be disposed in the vicinity below that inclined bottom surface. In addition, making that inclined bottom surface liquid repellent in advance makes it possible to recover the liquid inside the groove portion 55 more reliably.

In addition, in the first through fifth embodiments discussed above, the number and arrangement of the recovery ports of the measurement stage ST2 can be suitably modified.

In addition, in the first through fifth embodiments discussed above, the recovery ports can also be made movable in the Z axial directions.

In addition, in the first through fifth embodiments discussed above, the recovery ports can also be formed with a lyophilic material (e.g., a metal such as titanium).

In addition, in the first through fifth embodiments discussed above, if a plurality of the recovery ports 51 is provided along the X axial directions, then a lyophilic fine groove (e.g., having a width of approximately 0.5 mm) may be formed in, for example, the bottom surface of the groove portion 55, wherein the plurality of recovery ports 51 are formed, or in the stage upper surface F2 so as to connect adjoining recovery ports. In this case, the liquid inside that fine groove is collected by the capillary phenomenon, and can be efficiently recovered from the recovery ports 51.

In addition, in the first through fifth embodiments discussed above, moving the recovery ports 51 (groove portion 55) when recovering the liquid in the space of the optical path on the image plane side of the projection optical system PL from the recovery ports 51 (groove portion 55) makes it possible to recover the liquid more reliably. For example, the liquid can be recovered from the recovery ports 51 (groove portion 55) while, for example, alternately moving the measurement stage ST2 (substrate stage ST1) in the +Y and the −Y directions.

In addition, in the first through fifth embodiments discussed above, the plate member T of the substrate stage ST1 is detachably configured, but it does not necessarily need to be detachable, and may be integrally formed with the base material PHB.

In addition, in the first through fifth embodiments discussed above, the recovery ports 51 are provided to the measurement stage ST2, but they may be provided to the substrate stage ST1 instead of the measurement stage ST2, or they may be provided to each of the two stages.

In addition, in the first through fifth embodiments discussed above, it is preferable to provide in advance a buffer space of a prescribed volume, for example, along the recovery pipe 23 between the vacuum system (suction system) and the recovery ports 22 of the liquid recovery mechanism 20, or along the passageway 52 between the vacuum system (suction system) 53 and the recovery ports 51. The provision of such a buffer space makes it possible to continue the suction (recovery) of the liquid inside, for example, the recovery pipe 23 or the groove portion 55 (passageway 52) for a prescribed time because that buffer space is negatively pressurized even if the air intake (exhaust air) operation by the vacuum system is stopped due to, for example, a power failure.

In addition, each of the embodiments discussed above can also be adapted to a so-called multistage type exposure apparatus, which comprises a plurality of (e.g., two) movable substrate stages that each holds the substrate P, as disclosed in, for example, Japanese Unexamined Patent Application, Publication No. H10-163099, Japanese Unexamined Patent Application, Publication No. H10-214783, and Published Japanese Translation No. 2000-505958 of the PCT International Application.

As discussed above, the liquid LQ in the present embodiment is pure water. Pure water is advantageous because it can be easily obtained in large quantities at, for example, a semiconductor fabrication plant, and does not adversely impact, for example, the optical element (lens) and the photoresist on the substrate P. In addition, because pure water does not have an adverse impact on the environment and has an extremely low impurity content, it can also be expected to have the effect of cleaning the upper surface of the substrate P and the tip surface of the optical element of the projection optical system PL. Furthermore, the exposure apparatus may be provided with an ultrapure water manufacturing apparatus if the pure water supplied from, for example, the plant is of low purity.

Further, the refractive index n of pure water (water) with respect to the exposure light EL that has a wavelength of approximately 193 nm is said to be substantially 1.44; therefore, the use of ArF excimer laser light (193 nm wavelength) as the light source of the exposure light EL shortens the wavelength on the substrate P to 1/n, i.e., approximately 134 nm, and thereby a high resolution is obtained. Furthermore, because the depth of focus increases approximately n times, i.e., approximately 1.44 times, that of in air, the numerical aperture of the projection optical system PL can be further increased if it is preferable to ensure a depth of focus that is approximately the same as that when used in air, and the resolution is also improved from this standpoint.

The projection optical system of the embodiments discussed above fills the liquid in the space of the optical path on the image plane side of the tip optical element, but it is also possible to employ a projection optical system that also fills the liquid in the space of the optical path on the mask side of the tip optical element, as disclosed in PCT International Publication No. WO2004/019128.

Furthermore, although the liquid LQ in the present embodiment is water, it may be a liquid other than water; for example, if the light source of the exposure light EL is an $F_2$ laser, then this $F_2$ laser light will not transmit through water, so it would be acceptable to use as the liquid LQ a fluorine based fluid that is capable of transmitting $F_2$ laser light, such as perfluorinated polyether (PFPE) or fluorine based oil. In this case, the parts (components) that make contact with the liquid LQ are treated in order to make them lyophilic by forming a thin film with, for example, a substance that has a molecular structure that contains fluorine and that has low polarity. In addition, it is also possible to use as the liquid LQ a liquid (e.g., cedar oil) that is transparent to the exposure light EL, has the highest possible refractive index, and is stable with respect to the projection optical system PL and the photoresist coated on the front surface of the substrate P. In this case as well, the surface treatment is performed in accordance with the polarity of the liquid LQ used.

Furthermore, the substrate P in each of the abovementioned embodiments is not limited to a semiconductor wafer for fabricating semiconductor devices; for example, a glass substrate for a display device, a ceramic wafer for a thin film magnetic head, a mask or the original plate of a reticle (synthetic quartz, silicon wafer) used by an exposure apparatus can be employed as the substrate P.

The exposure apparatus EX can also be adapted to a step-and-scan type scanning exposure apparatus (scanning stepper) that scans and exposes the pattern of the mask M by synchronously moving the mask M and the substrate P, as well as to a step-and-repeat type projection exposure apparatus (stepper) that performs full field exposure of the pattern of the mask M with the mask M and the substrate P in a stationary state, and sequentially steps the substrate P.

In addition, the exposure apparatus EX can also be adapted to an exposure apparatus that uses a projection optical system (e.g., a dioptric projection optical system, which does not include a reflecting element, with a ⅛ reduction magnification) to perform full field exposure of a reduced image of a first pattern onto the substrate P in a state wherein the first pattern and the substrate P are substantially stationary. In this case, the exposure apparatus EX can also be adapted to a stitching type full field exposure apparatus that subsequently further uses that projection optical system to perform full field exposure of a reduced image of a second pattern, in a state wherein the second pattern and the substrate P are substantially stationary, onto the substrate P so that the second pattern partially overlaps the first. In addition, the stitching type exposure apparatus can also be adapted to a step-and-stitch type exposure apparatus that transfers at least two patterns onto the substrate P so that they partially overlap, and sequentially steps the substrate P.

The type of exposure apparatus EX is not limited to semiconductor device fabrication exposure apparatuses that expose the pattern of a semiconductor device on the substrate P, but can also be widely adapted to exposure apparatuses for fabricating liquid crystal devices or displays, and exposure apparatuses for fabricating, for example, thin film magnetic heads, imaging devices (CCDs), or reticles and masks.

The exposure apparatus EX of the embodiments in the present application is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from these various subsystems, there are also the processes of assembling each individual subsystem. When the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room wherein, for example, the temperature and the cleanliness level are controlled.

Figure 15:
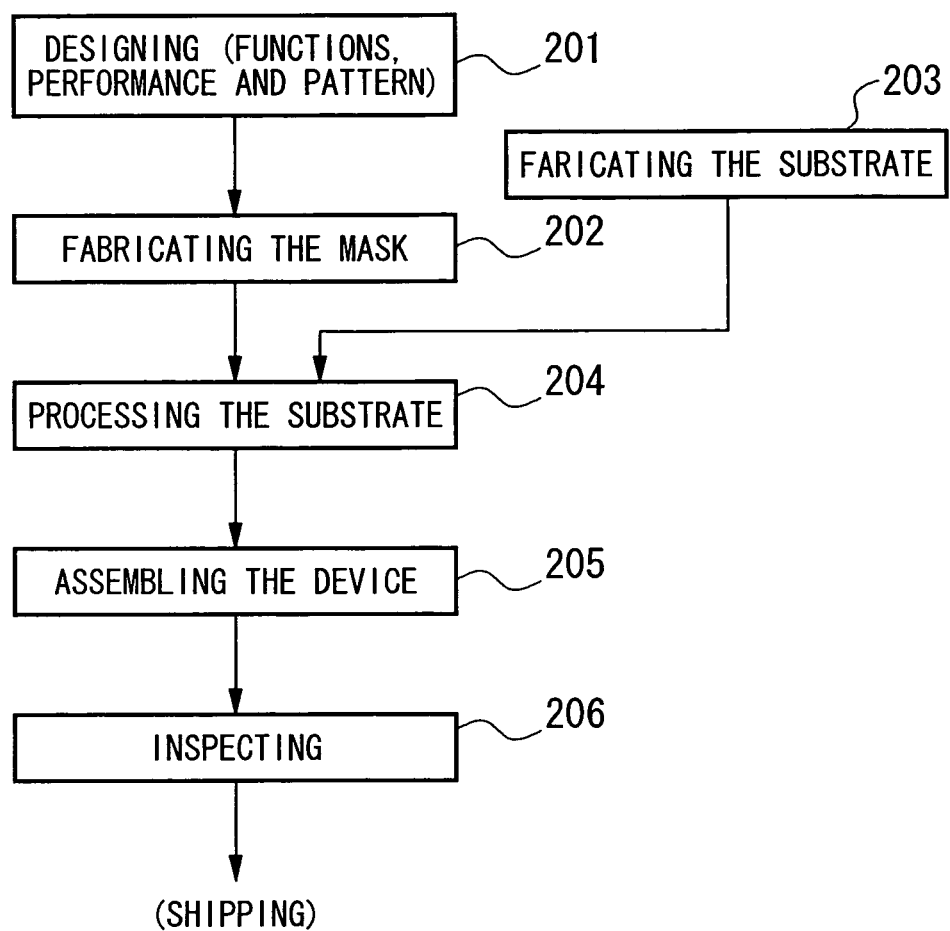
FIG. 15 is a flow chart diagram that depicts one example of a process for fabricating a microdevice.

As shown in FIG. 15, a micro-device, such as a semiconductor device, is manufactured by: a step 201 that designs the functions and performance of the micro-device; a step 202 that fabricates a mask (reticle) based on this design step; a step 203 that fabricates a substrate, which is the base material of the device; a substrate processing step 204 that includes a process wherein the exposure apparatus EX of the embodiments discussed above exposes a pattern of the mask onto the substrate; a device assembling step 205 (comprising a dicing process, a bonding process, and a packaging process); an inspecting step 206; and the like.

The invention claimed is:
1. A lithographic apparatus comprising:
a projection system by which a patterned radiation beam is projected onto a substrate;
a liquid confinement system which is configured to at least partly confine liquid in a space beneath the projection system, the liquid confinement system having an inlet and an outlet, the inlet being configured to supply the liquid to beneath a lower surface of the liquid confinement system, the outlet being disposed to surround the inlet and being configured to remove the liquid from beneath the lower surface;
at least a first stage and a second stage;
a positioning system configured to move the first stage and the second stage;

a controller configured to control the positioning system; and a channel system, wherein:

the controller controls the positioning system to perform a joint scan movement in which the first stage and the second stage cooperate while moving between a first situation and a second situation, the liquid being confined between the first stage and the projection system in the first situation and the liquid being confined between the second stage and the projection system in the second situation, such that during the joint scan movement the liquid is essentially confined within the space beneath the projection system, the first stage has a first immersion cross edge at or near a side of the first stage, the second stage has a second immersion cross edge at or near a side of the second stage, the first immersion cross edge and the second immersion cross edge being face-to-face with each other with a gap between the immersion cross edges during the joint scan movement of the first and second stages, the first stage has a first lower portion located below the first immersion cross edge of the first stage, the first lower portion protruding outward beyond the first immersion cross edge and being stationary relative to the first immersion cross edge, the second stage has a second lower portion located below the second immersion cross edge of the second stage, the second immersion cross edge of the second stage protruding outward beyond the second lower portion to form an overhang portion of the second stage, the overhang portion having the second immersion cross edge of the second stage, during the joint scan movement, the first lower portion of the first stage is disposed below the gap and at least a part of the first lower portion is disposed under the overhang portion of the second stage, and the channel system has an opening provided at the first lower portion of the first stage, and the channel system is configured to drain the liquid that passes through the gap formed between the first and second immersion cross edges during the joint scan movement via the opening.

2. The lithographic apparatus according to claim 1, wherein the liquid is confined between the substrate held by the first stage of the two stages and the projection system in the first situation.

3. The lithographic apparatus according to claim 2, wherein the second stage holds another substrate.

4. The lithographic apparatus according to claim 2, wherein the first stage is moved away from under the projection system to a substrate-exchange position in the second situation.

5. The lithographic apparatus according to claim 2, wherein in the first situation, the second stage stays for a period of time at a position away from under the projection system while moving the first stage under the projection system.

6. The lithographic apparatus according to claim 2, wherein the second stage is moved away from the first stage while the first stage is moved under the projection system in the first situation, and the first stage and the second stage are moved close to each other before the second situation and before the first stage is moved away from under the projection system.

7. A device manufacturing method comprising:

exposing a substrate to a patterned beam through the projection system of the lithographic apparatus of claim 1; and processing the exposed substrate.

8. The lithographic apparatus according to claim 1, wherein during the joint scan movement, an upper surface of the first stage is adjacent to an upper surface of the second stage via the gap.

9. The lithographic apparatus according to claim 8, wherein a positional relationship between the upper surface of the first stage and the part of the first stage disposed under the overhang portion is substantially fixed.

10. The lithographic apparatus according to claim 1, wherein during the joint scan movement, an upper surface of the first stage is adjacent to an upper surface of the second stage via the gap, and the overhang portion has the upper surface of the second stage.

11. The lithographic apparatus according to claim 1, wherein the opening is connected to a vacuum system, and gas and the liquid are separated from each other between the opening and the vacuum system.

12. The lithographic apparatus according to claim 1, wherein the second stage has a plurality of support portions configured to support the substrate and a wall portion that is disposed to surround the support portions, the second stage being configured to hold the substrate on the support portions by sucking a gas from a space surrounded by the wall portion and a bottom surface of the substrate supported by the support portions.

* * * * *